(12) United States Patent
Kang

(10) Patent No.: US 12,191,820 B2
(45) Date of Patent: Jan. 7, 2025

(54) LOW NOISE AMPLIFIER AND RECEIVER

(71) Applicant: Samsung Electronics Co., Ltd., Suwon-si (KR)

(72) Inventor: Byoung Joong Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 342 days.

(21) Appl. No.: 17/876,053

(22) Filed: Jul. 28, 2022

(65) Prior Publication Data
US 2023/0142523 A1    May 11, 2023

(30) Foreign Application Priority Data

Nov. 11, 2021 (KR) .......... 10-2021-0154903
Jan. 18, 2022 (KR) .......... 10-2022-0007169

(51) Int. Cl.
| | |
|---|---|
| H04B 1/16 | (2006.01) |
| H03F 1/02 | (2006.01) |
| H03F 1/26 | (2006.01) |
| H03F 3/19 | (2006.01) |
| H03F 3/45 | (2006.01) |

(52) U.S. Cl.
CPC .......... *H03F 3/19* (2013.01); *H04B 1/16* (2013.01); *H03F 2200/294* (2013.01)

(58) Field of Classification Search
None
See application file for complete search history.

(56) References Cited

U.S. PATENT DOCUMENTS

| | | | |
|---|---|---|---|
| 6,977,552 B2 | 12/2005 | Macedo | |
| 7,486,135 B2 | 2/2009 | Mu | |
| 9,154,356 B2 | 10/2015 | Tasic et al. | |
| 9,160,598 B2 | 10/2015 | Davierwalla et al. | |
| 9,431,963 B2* | 8/2016 | Wang | H03F 1/26 |
| 9,479,131 B2* | 10/2016 | Youssef | H03F 3/68 |
| 9,603,187 B2* | 3/2017 | Tasic | H03F 3/193 |
| 9,774,303 B1* | 9/2017 | Ayranci | H03F 1/223 |
| 9,917,614 B1* | 3/2018 | Kang | H03G 1/0029 |
| 9,973,149 B2* | 5/2018 | Ayranci | H03F 1/0277 |
| 10,250,195 B2* | 4/2019 | Kim | H03F 1/0277 |
| 10,396,714 B2 | 8/2019 | Kobayashi et al. | |
| 10,686,413 B2 | 6/2020 | Yoo et al. | |
| 11,005,426 B2* | 5/2021 | Kim | H03F 1/223 |
| 2020/0389133 A1 | 12/2020 | Hiraoka | |
| 2021/0058044 A1* | 2/2021 | Ayranci | H03F 3/45188 |

\* cited by examiner

*Primary Examiner* — Pablo N Tran
(74) *Attorney, Agent, or Firm* — Harness, Dickey & Pierce, P.L.C.

(57) ABSTRACT

Provided are a low noise amplifier and a receiver. The low noise amplifier comprises at least one input port configured to receive an input signal including a carrier, first to third output ports connected to first to third load circuits, respectively, and configured to transmit an output signal, a first amplifier stage comprising a first type gain stage connected to the input port and first to third first type drive stages connected to the first to third output ports, respectively and second to third amplifier stages, each comprising a second type gain stage and a second type drive stage, wherein the low noise amplifier is configured to vary an impedance of an input transistor included in each of the first type gain stage and the second type gain stage, so that an input impedance is uniform even when operating in a plurality of operation modes.

20 Claims, 19 Drawing Sheets

| Mode | On | | | | Off | | | |
|---|---|---|---|---|---|---|---|---|
| | $M_1$ | $M_2$ | $M_3$ | TOTAL | $M_1$ | $M_2$ | $M_3$ | TOTAL |
| 1CC | 3w | 0 | 0 | 3w | 0 | 1.5w | 1.5w | 3w |
| Noncontiguous 2CA | 1.5w | 1.5w | 0 | 3w | 1.5w | 0 | 1.5w | 3w |
| Noncontiguous 3CA | 1w | 1w | 1w | 3w | 2w | 0.5w | 0.5w | 3w |

<Input Impedance Model>

LOW NOISE AMPLIFIER AND RECEIVER

CROSS-REFERENCE TO RELATED APPLICATION

This application claims priority from Korean Patent Application No. 10-2021-0154903 filed on Nov. 11, 2021 and Korean Patent Application No. 10-2022-0007169 filed on Jan. 18, 2022 in the Korean Intellectual Property Office, and all the benefits accruing therefrom under 35 U.S.C. 119, the contents of which in its entirety are herein incorporated by reference.

BACKGROUND

1. Technical Field

The inventive concepts relate to a low noise amplifier and a receiver, and more particularly, to a low noise amplifier included in a wireless communication device.

2. Description of the Related Art

Carrier aggregation may refer to the use of a plurality of carriers together in transmission to one wireless communication device or in transmission from one wireless communication device. A frequency domain transmitted by one carrier may be referred to as a frequency channel, and an amount of data transmitted through wireless channels may be increased due to carrier aggregation supporting a plurality of frequency channels. In the carrier aggregation, frequency channels through which data is transmitted may be variously arranged, and a transmitter, receiver, or transceiver of a wireless communication device may advantageously support various arrangements of such frequency channels.

SUMMARY

Aspects of the inventive concepts provide a low noise amplifier which is implemented in a smaller area to more efficiently support variously arranged frequency channels, and a receiver including the same.

However, aspects of the inventive concepts are not restricted to those set forth herein. The above and other aspects of the inventive concepts will become more apparent to one of ordinary skill in the art to which the inventive concepts pertain by referencing the detailed description of the inventive concepts given below.

According to an aspect of the inventive concepts, there is provided a low noise amplifier comprising at least one input port configured to receive an input signal including a carrier, first to third output ports connected to first to third load circuits, respectively, and configured to transmit an output signal, a first amplifier stage comprising a first type gain stage connected to the input port and first to third first type drive stages connected to the first to third output ports, respectively and second to third amplifier stages, each comprising a second type gain stage and a second type drive stage, wherein the low noise amplifier is configured to vary an impedance of an input transistor included in each of the first type gain stage and the second type gain stage, so that an input impedance is uniform even when operating in a plurality of operation modes.

According to another aspect of the inventive concepts, there is provided a low noise amplifier comprising: at least one input port configured to receive a carrier as an input signal;

first to n-th output ports connected to n load circuits, respectively, n is a natural number greater than or equal to 2, a first amplifier stage comprising a first gain stage connected to the input port and configured to amplify the input signal and n drive stages connected to the first to nth output ports, respectively and second to n-th amplifier stages, each comprising a second gain stage connected to the input port and configured to amplify the input signal and a cascode transistor connected between one of the second to nth output ports and an output terminal of the gain stage and configured to transmit the amplified input signal to the load circuit corresponding to the output port, wherein each of the first gain stage and the second gain stage comprises an input capacitor having one end connected to the input port, a degeneration inductor having one end connected to a ground terminal, and an input transistor having a gate connected to the other end of the input capacitor and connected between an input node of the drive stage and the other end of the degeneration inductor, and the input transistor is configured to vary an impedance so that an input impedance and a parasitic impedance are uniform regardless of an operation mode.

According to another aspect of the inventive concepts, there is provided a receiver capable of wireless communication, comprising: switches/duplexers configured to route a transmission/reception input signal, input circuits configured to provide the routed input signal by performing power and impedance matching, a low noise amplifier configured to provide first to third output signals by amplifying the provided input signal and first to third load circuits configured to receive the first to third output signals, respectively, wherein the low noise amplifier comprises a first amplifier stage connected between an input port through which the input signal is received and the first to third load circuits, a second amplifier stage connected between the input port and the second load circuit and a third amplifier stage connected between the input port and the third load circuit, and the first to third amplifier stages are configured to vary an input transistor so that the low noise amplifier has an uniform input impedance regardless of an operation mode of the low noise amplifier.

It should be noted that the effects of the inventive concepts are not limited to those described above, and other effects of the inventive concepts will be apparent from the following description.

BRIEF DESCRIPTION OF THE DRAWINGS

The above and other aspects and features of the inventive concepts will become more apparent by describing in detail example embodiments thereof with reference to the attached drawings, in which.

DETAILED DESCRIPTION OF EXAMPLE EMBODIMENTS

Hereinafter, a low noise amplifier according to some example embodiments of the inventive concepts will be described with reference to FIGS. 1 to 15.

Figure 1:
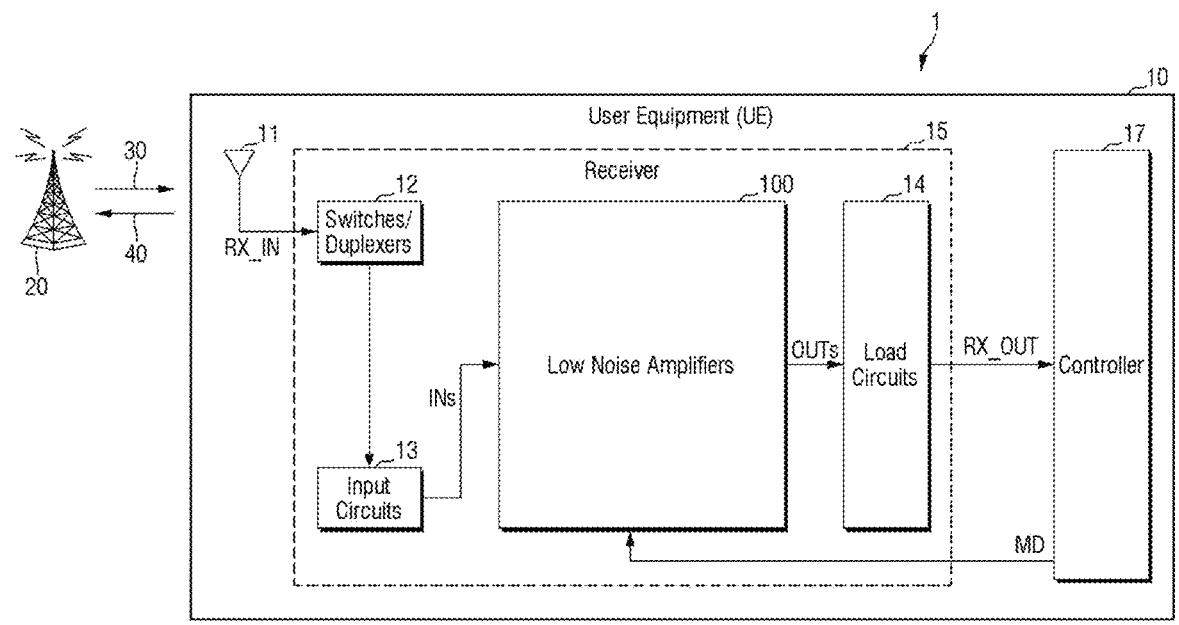
FIG. 1 is a block diagram illustrating a wireless communication system 1 including a user equipment (UE) 10 and a base station (BS) 20 according to example embodiments of the inventive concepts.

FIG. 1 is a block diagram illustrating a wireless communication system 1 including a user equipment (UE) 10 and a base station (BS) 20 according to example embodiments of the inventive concepts. As shown in FIG. 1, the UE 10 and the BS 20 may communicate with each other through a downlink (DL) 30 and an uplink (UL) 40.

The wireless communication system 1 may be a Long-Term Evolution (LTE) system, a code division multiple access (CDMA) system, a Global System for Mobile Communications (GSM) system, a wireless local area network (WLAN) system, or another wireless communication system as a non-limiting example. The UE 10, which is a wireless communication device, may be fixed or may be moved, and may refer to various devices which may communicate with the BS 20 to transmit and receive data and/or control information. For example, the UE 10 may be referred to as a terminal equipment, a mobile station (MS), a mobile terminal (MT), a user terminal (UT), a subscribe station (SS), a wireless device, a handheld device, or the like. The BS 20 may generally refer to a fixed station which communicates with the UE and/or another BS, and may exchange data and control information by communicating with the UE and/or another BS. For example, the BS 20 may be referred to as a node B, an evolved-Node B (eNB), a base transceiver system (BTS), an access point (AP), or the like.

The wireless communication network between the UE 10 and the BS 20 may support communication of multiple users by sharing available network resources. For example, in a wireless communication network, information may be transferred in various methods such as CDMA, frequency division multiple access (FDMA), time division multiple access (TDMA), orthogonal frequency division multiple access (OFDMA), single carrier frequency division multiple access (SC-FDMA), and the like.

The wireless communication system 1 may support carrier aggregation using a plurality of carriers. That is, the UE 10 and the BS 20 may transmit or receive data using a plurality of carriers simultaneously. Carriers used by the UE 10 and the BS 20 in carrier aggregation may be referred to as component carriers, and a frequency domain transmitted by one component carrier may be referred to as a frequency channel. A frequency channel may be included in a frequency band, and the frequency band may include a plurality of contiguous frequency channels. For example, in LTE, a width of a frequency channel covered by one component carrier may be 20 MHz, and one frequency band may cover up to 200 MHz. As described below with reference to FIGS. 2AA to 2CB, frequency channels used by the UE 10 and the BS 20 may be variously arranged.

The UE 10 (or the BS 20) may include a structure for appropriately processing signals received through various frequency channels. For example, the UE 10 may include a receiver 15 for separating the frequency channels from each other. Also, the receiver 15 may also support transmission not using carrier aggregation, that is, processing of signals including one carrier. Referring to FIG. 1, the UE 10 may include an antenna 11, the receiver 15, and/or a controller 17. Also, according to some example embodiments, the UE 10 may further include a transceiver configured to transmit a signal using the antenna 11.

The antenna 11 may provide a receiver input signal RX_IN by receiving a signal, which is transmitted by the BS 20 and includes at least one carrier. The receiver 15 may provide a receiver output signal RX_OUT from the receiver input signal RX_IN provided from the antenna 11. For example, the receiver 15 may provide a receiver output signal RX_OUT including at least one signal in a baseband from the receiver input signal RX_IN received through the plurality of frequency channels.

The controller 17 may detect data transmitted by the BS 20 by processing the receiver output signal RX_OUT, for example, by performing sampling, demodulation, decoding, and the like. Also, the controller 17 may set a mode of the receiver 15 according to a preset type of carrier aggregation. For example, carriers used by the BS 20 to transmit signals may be preset, and the controller 17 may generate a mode signal MD based on the set carriers.

The mode (or an operation mode) of the receiver 15 may be determined according to the mode signal MD provided by the controller 17. That is, the receiver 15 may provide the receiver output signal RX_OUT by processing the receiver input signal RX_IN differently according to the mode signal MD. As illustrated in FIG. 1, the receiver 15 may include switches/duplexers 12, input circuits 13, low noise amplifiers (LNAs) 100, and/or load circuits 14.

Figure 15:
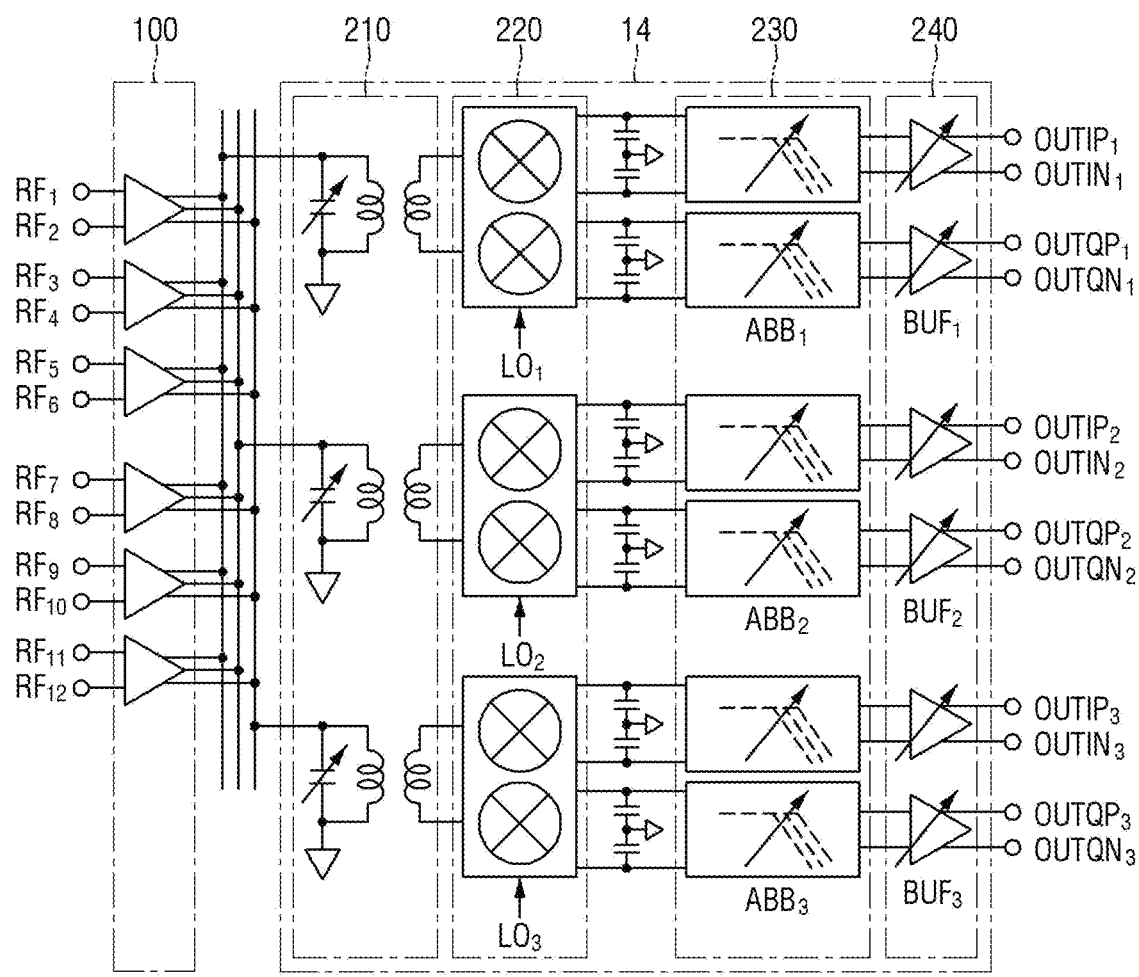
FIG. 15 is a view illustrating an example of a receiver including an LNA according to some example embodiments.

The switches/duplexers 12 may route the receiver input signal RX_IN to provide to the input circuits 13. The input circuits 13 may include matching circuits which perform power and/or impedance matching between the antenna 11 or the switches/duplexers 12 and the LNAs 100, and may provide input signals INs. As illustrated in FIG. 15, the input signals INs may be provided through a plurality of lines.

The LNAs 100 may provide output signals OUTs by amplifying the input signals INs. The output signals OUTs output from the LNAs 100 by amplifying the input signals INs may be related to carriers. For example, signals included in the output signals OUTs may correspond to carriers, that is, frequency channels, respectively. Accordingly, as described below, the load circuits 14 may include mixers, the mixers may down-convert each of the signals included in the output signals OUTs based on the carriers, and the load circuits 14 may provide the receiver output signal RX_OUT including a plurality of baseband signals. As described above, the carriers included in the input signals INs (or the receiver input signal RX_IN) may be variously set, and the LNAs 100 may provide the output signals OUTs according to the setting of the carriers.

As described above, the LNA 100 according to some example embodiments may have a structure in which amplification paths of the input signals INs are changed according to the setting of the carriers (or the arrangement of the frequency channels), and thus the frequency channels may be efficiently separated despite the variation of the arrangement of the frequency channels. In some example embodiments, the LNA 100 may vary each input transistor to have a uniform input impedance regardless of the operation mode.

Hereinafter, it will be appreciated that while example embodiments of the inventive concepts will be described with reference to the UE 10, example embodiments are also applicable to the BS 20 which receives the signals from the UE 10 through the plurality of frequency channels. Also, according to example embodiments of the inventive concepts, the LNAs 100 may be included in a single package as semiconductor devices, the LNAs 100 and the load circuits 14 may be included in a single package as semiconductor devices, or the receiver 15 may be included in a single package as a semiconductor device.

Figure 2A:
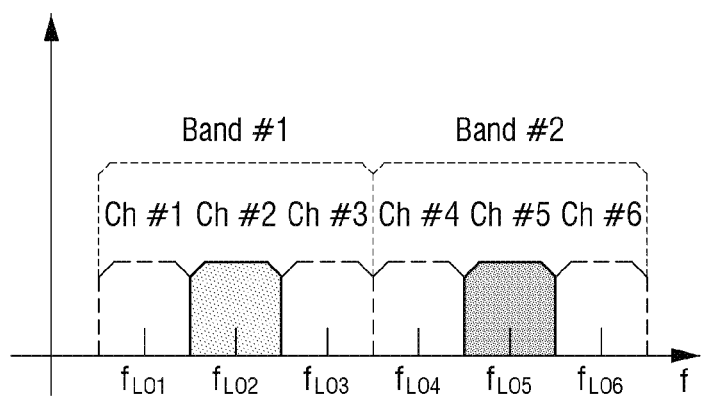
FIGS. 2AA to 2CB are views illustrating example types of carrier aggregation and example structures for extracting signals from frequency channels corresponding to the types of carrier aggregation.
Figure 2A:
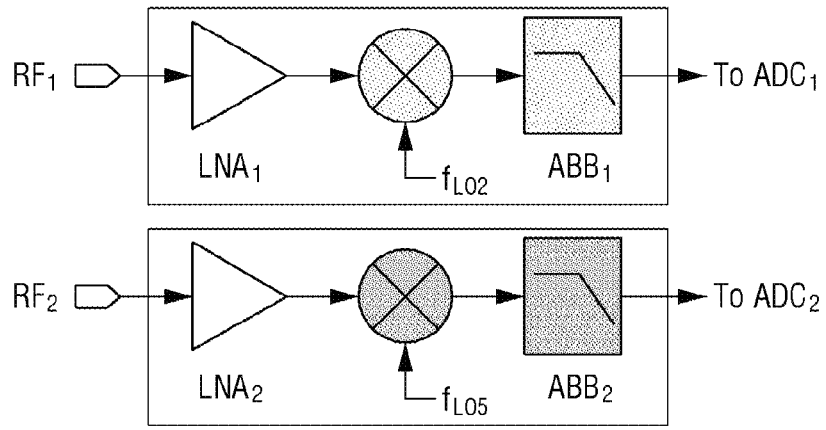

FIGS. 2AA to 2CB are views illustrating example types of carrier aggregation and example structures for extracting signals from frequency channels corresponding to the types of carrier aggregation. Specifically, FIGS. 2AA and 2AB illustrate inter-band carrier aggregation, FIGS. 2BA and 2BB illustrate contiguous intra-band carrier aggregation, and FIGS. 2CA and 2CB illustrate non-contiguous intra-band carrier aggregation. In the examples of FIGS. 2AA to 2CB, two bands BAND #1 and BAND #2 may be used for transmission of signals, and one band may have three frequency channels (or three carriers).

Referring to FIG. 1, and FIGS. 2AA to 2CB, an LNA 100 included in the LNAs 100 may output a signal, which is obtained by amplifying a signal received through one line, through at least one line. For example, the LNA 100 may output a first output signal OUT1 or second output signal OUT2 by amplifying a first input signal IN1 included in the input signals INs based on the setting of the carriers. For example, the signal output from the LNA 100 may be determined based on the mode signal MD received from the controller 17 (see FIG. 1).

Referring to FIGS. 2AA and 2AB, in inter-band carrier aggregation, frequency channels in use may be arranged in different bands, respectively. For example, as illustrated in FIGS. 2AA and 2AB, frequency channels CH #2 and CH #5 in use may be included in the first and second bands BAND #1 and BAND #2, respectively, and thus may be relatively far apart from each other. Two noise amplifiers LNA1 and LNA2 may output first and second output signals OUT1 and OUT2 to a mixer by amplifying first and second input signals IN1 and IN2, respectively, and the first and second output signals OUT1 and OUT2 may be down-converted in the mixer, that is, converted into baseband signals, by frequencies $f_{LO1}$ and $f_{LO2}$ corresponding to the frequency channels CH #2 and CH #5, respectively.

Figure 2B:
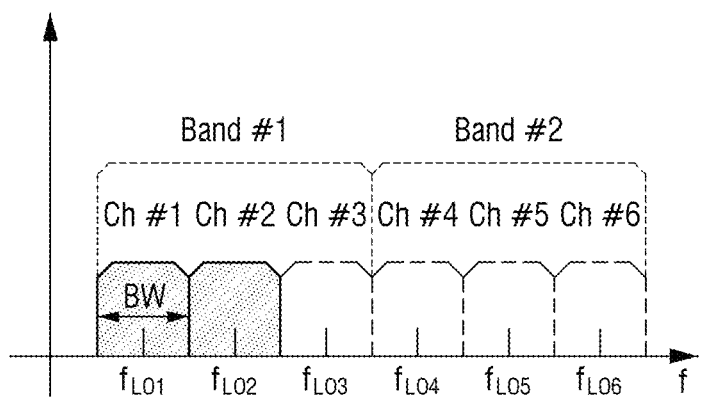
Figure 2B:
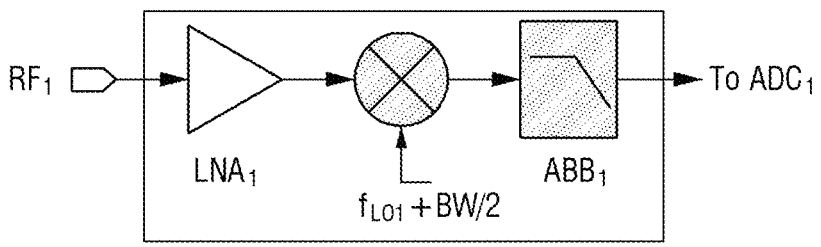

Referring to FIGS. 2BA and 2BB, in contiguous intra-band carrier aggregation, frequency channels in use may be continuously arranged in the same band. For example, as illustrated in FIGS. 2BA and 2BB, frequency channels CH #1 and CH #2 in use may be included in a first band BAND #1, and may be adjacent to each other. An LNA 2b may output a first output signal OUT1 by amplifying a first input signal IN1, and the first output signal OUT1 may be down-converted by an intermediate frequency (e.g., $(f_{LO1}+f_{LO2})/2$) of frequencies $f_{LO1}$ and $f_{LO2}$ of carriers corresponding to the frequency channels CH #1 and CH #2 in use, respectively.

Figure 2C:
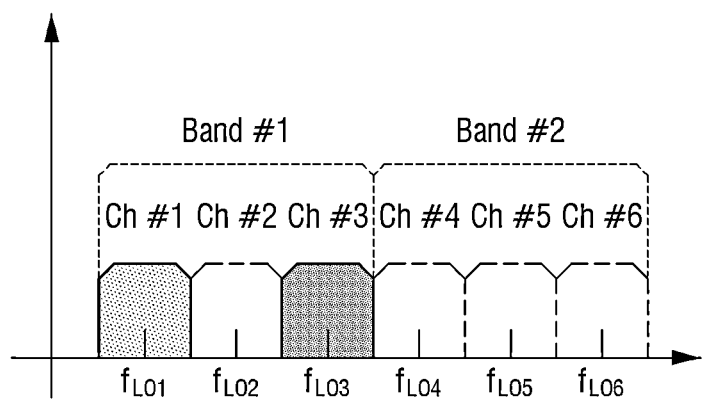
Figure 2C:
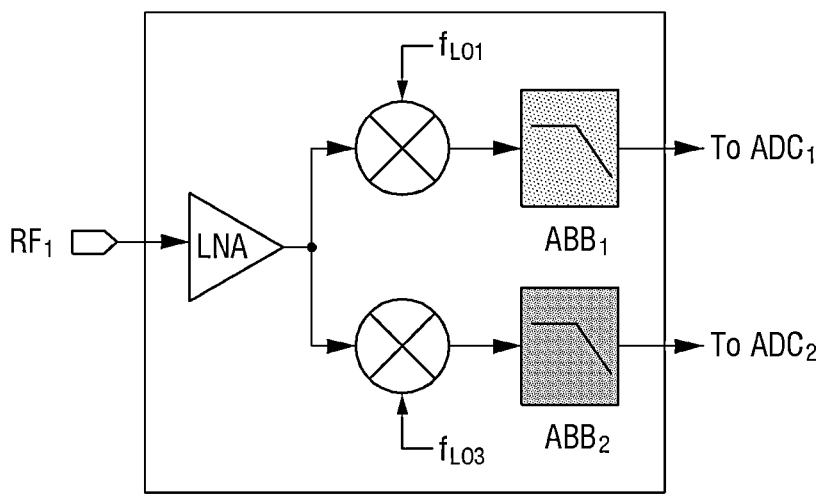

Referring to FIGS. 2CA and 2CB, in non-contiguous intra-band carrier aggregation, frequency channels in use may be discretely arranged (or be spaced) in the same band. For example, as illustrated in FIGS. 2CA and 2CB, frequency channels CH #1 and CH #3 in use may be included in a first band BAND1, and may be spaced apart from each other. The frequency channels CH #1 and CH #3 in use in the non-contiguous intra-band carrier aggregation may be arranged relatively adjacent to each other as compared to those in the inter-band carrier aggregation of FIGS. 2AA and 2AB, whereas the frequency channels CH #1 and CH #3 may be arranged over a wide frequency range as compared to those in the contiguous intra-band carrier aggregation of FIGS. 2BA and 2BB.

As an example for separating the frequency channels CH #1 and CH #3 in use in the non-contiguous intra-band carrier aggregation, as illustrated in FIGS. 2CA and 2CB, an LNA may output two output signals, that is, first and second output signals OUT1 and OUT2, from a first input signal IN1, and the first and second output signals OUT1 and OUT2 may be down-converted by frequencies $f_{LO1}$ and $f_{LO3}$ corresponding to the frequency channels CH #1 and CH #3, respectively. In some example embodiments, the LNA may generate one output signal by amplifying one input signal as illustrated in FIGS. 2AA and 2AB, and FIGS. 2BA and 2BB or may generate two output signals by amplifying one input signal IN1 as illustrated in FIGS. 2CA and 2CB in order to support different types of carrier aggregation.

In lower cost narrow band application in which the receiver 15 alone needs to secure sensitivity without the help of an external LNA, a cascode LNA including a source degeneration inductor may be used in order to secure lower power and/or improved narrow band in the receiver 15. The source degeneration inductor which is a passive element has a larger size than other active elements and thus occupies a more significant area in the LNA. The size of the inductor tends to become larger as the frequency decreases.

Since the source degeneration inductor affects the gain of the LNAs, it is not shared by two or more LNAs that simultaneously operate. For example, when two or more LNAs operating simultaneously share a source degeneration inductor, more DC and AC currents flow compared to the example embodiments of using one LNA for the source degeneration inductor, and hence gate-source voltage applied to a transistor of a gain stage decreases, which further deteriorates the gain of the LNAs.

For this reason, the LNA which has the same number of paths as the number of carrier components and supports the non-contiguous intra-band carrier aggregation may need to have a source degeneration inductor individually allocated for each path, and accordingly, the area of the LNA may increase. In order to reduce the area of the LNAs, attempts to reduce the number of inductors by sharing a source degeneration inductor between two or more LNAs having different input signals would be advantageous.

According to some example embodiments, the LNA may include one first type amplifier stage and n−1 (n is a natural number greater than or equal to 2) second type amplifier stages for n load circuits so that the LNA can be implemented with fewer degeneration inductors while supporting all operation modes described with reference to FIGS. 2AA to 2CB. For example, the first type amplifier stage may include one first type gain stage and n first type drive stages. For example, the second type amplifier stage may include one second type gain stage and one second type drive stage.

The first type gain stage may include an input transistor and one first degeneration inductor according to some example embodiments. Alternatively, according to some example embodiments, the first type gain stage may include an input transistor and at least two first degeneration inductors connected in series, and a compensation degeneration inductor connected between a normal degeneration inductor and the first type drive stage may have both ends connected to a switch. The switch may be turned on according to the operation mode (e.g., inter-band carrier aggregation mode) to allow current to bypass the compensation degeneration inductor. The first type drive stages may each include one cascode transistor and the total number of cascode transistors may correspond to the number of load circuits. For example, when there are n load circuits (n is a natural number greater than or equal to 2), n cascode transistors may be provided to be connected, respectively, to the load circuits. The cascode transistors may be enabled or disabled by adjusting a signal applied to a gate according to the operation mode.

The second type gain stage may include one input transistor and one second degeneration inductor according to some example embodiments. The second type drive stage may include one cascode transistor connected to each load circuit.

Embodiments of the LNA will be described in detail with reference to FIG. 3 and other drawings.

Figure 3:
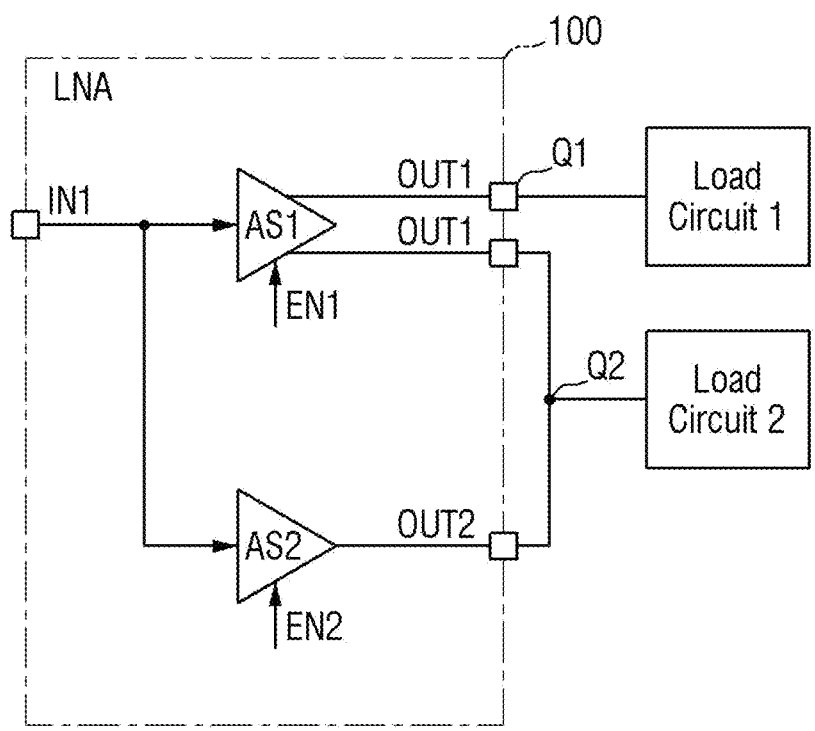
FIG. 3 is a block diagram illustrating an LNA according to some example embodiments.
Figure 4:
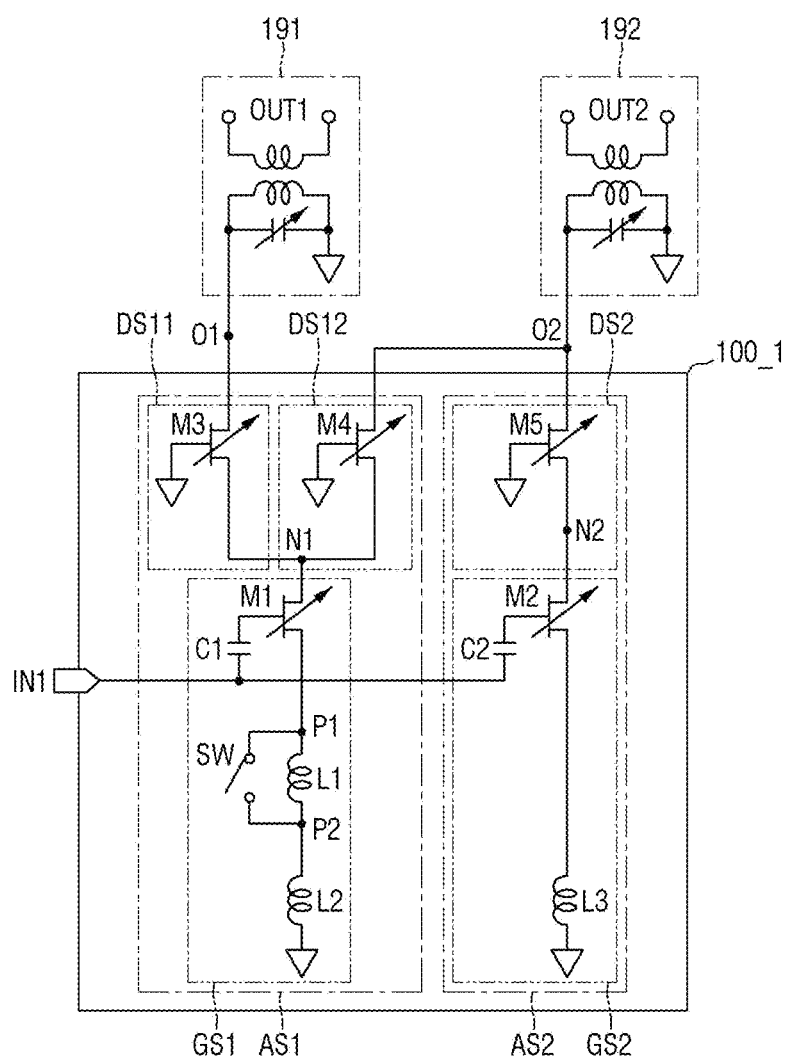
FIG. 4 is a circuit diagram of the LNA of FIG. 3.
Figure 5:
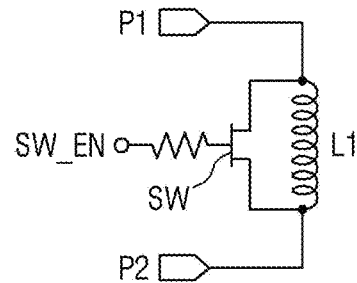
FIG. 5 is a diagram illustrating the degeneration inductor L1 and the switch shown in FIG. 4.

FIG. 3 is a block diagram illustrating an LNA according to some example embodiments, and FIG. 4 is a circuit diagram of the LNA of FIG. 3. FIG. 5 is a diagram illustrating the degeneration inductor L1 and the switch shown in FIG. 4. The LNA of FIGS. 3 and 4 is an example embodiment described based on aggregation of one carrier for convenience of description, and it should be noted that the scope of the inventive concepts is not limited thereto as long as the same technical idea is applicable.

Referring to FIGS. 3, 4, and 5, an LNA 100 may include one input port IN1, two amplifier stages AS1 and AS2, and/or two output ports Q1 and Q2.

The first and second amplifier stages AS1 and AS2 may be selectively enabled. For example, based on the mode signal MD received from the controller 17, the first amplifier stage AS1 may be enabled and the second amplifier stage AS2 may be enabled in a first mode. Accordingly, the first input signal IN1 may be amplified by the first amplifier stage AS1 or the second amplifier stage AS2.

The amplifier stage AS1 amplifies the input signal received through the input port IN1 and transmits the amplified input signal to a load circuit (Load circuit 1) and/or a load circuit (Load circuit 2) through the output port Q1 and/or the output port Q2. The amplifier stage AS2 amplifies the input signal received through the input port IN1 and transmits the amplified input signal to the load circuit Load circuit 2 through the output port Q2. The amplifier stages AS1 and AS2 may be selectively enabled.

The amplifier stage AS1 may include one gain stage GS1 and a plurality of drive stages DS11 and DS12. According to some example embodiments, the gain stage GS1 includes an input transistor M1, an input capacitor C1, and/or degeneration inductors L1 and L2. The input transistor M1 is connected between one end of the degeneration inductor and an input terminal of the drive stage DS11, and the input capacitor is connected between the input port IN1 and a gate of the input transistor M1. When the input signal is applied, the input signal passes through the input capacitor C1 and the input transistor M1 operates. A signal amplified according to the transconductance of the input transistor M1 is output to the drive stage DS11 and the drive stage DS12.

The degeneration inductors L2 and L1 are connected in series between a ground terminal and one end of the input transistor M1. For example, the degeneration inductor L2 close to the ground terminal may be referred to as a normal degeneration inductor and the degeneration inductor L1 close to the input transistor may be referred to as a compensation degeneration inductor.

According to some example embodiments, the compensation degeneration inductor L1 may include a switch SW connected to both ends thereof. The switch SW may be turned on/off according to a switch enable signal SW_EN. According to some example embodiments, in the example of intra-band carrier aggregation, when one of the two amplifier stages is turned on, an input impedance of the LNA may be reduced even if the same current flowing in a path of each amplifier stage as the current in the example of inter-carrier aggregation is applied. Accordingly, a gain of the LNA 100 is also degraded. Thus, the switch SW may be turned on to short circuit the degeneration inductor L1, thereby compensating for the degraded gain. In some example embodiments, since the degeneration inductor L1 is provided to compensate for a gain, the degeneration inductor L1 may have a size corresponding to the reduction in impedance according to the design.

The drive stages DS11 and DS12 may include cascode transistors M3 and M4, respectively. According to some example embodiments, the number of cascode transistors may correspond to the number of load circuits 191 and 192. For example, the drive stage DS11 includes the cascode transistor M3 connected between one end of the input transistor M1 and an output port O1 for the load circuit 191. The drive stage DS12 includes the cascode transistor M4 connected between one end of the input transistor M1 and an output port O2 for the load circuit 192.

According to some example embodiments, the input transistor M1 and the cascode transistors M3 and M4, which are variable transistors, may amplify the received input signal with a varied impedance according to settings and output the amplified input signal to the output ports O1 and O2.

The amplifier stage AS2 may include one gain stage GS2 and one drive stage DS2. According to some example embodiments, the gain stage GS2 includes an input transistor M2, an input capacitor C2, and/or degeneration inductor L3. The input transistor M2 is connected between one end of the degeneration inductor L3 and an input terminal of the drive stage DS2 and the input capacitor C2 is connected between the input port IN1 and a gate of the input transistor M2. When the input signal is applied, the input signal passes through the input capacitor C2 and the input transistor M2 operates. A signal amplified according to the transconductance of the input transistor M2 is output to the drive stage DS2.

The drive stage DS2 may include a cascode transistor M5. The drive stage DS2 includes the cascode transistor M5 connected between one end N2 of the input transistor M2 and the output port O2 for the load circuit 192.

According to some example embodiments, the inductance of the degeneration inductor L3 may be the same as that of the degeneration inductor L2. According to some example embodiments, the degeneration inductor L3 may have inductance that is different from combined inductance of the degeneration inductors L1 and L2. For example, combined inductance of the amplifier stage AS1 may be greater than inductance of the other amplifier stage AS2.

According to some example embodiments, the input transistor M2 and the cascode transistor M5, which are variable transistors, may amplify the received input signal with a varied impedance according to settings and output the amplified input signal to the output port O2. Accordingly, even when the LNA 100 operates in various operation modes, it may have the same or substantially the same input signal amplification ratio.

Figure 6A:
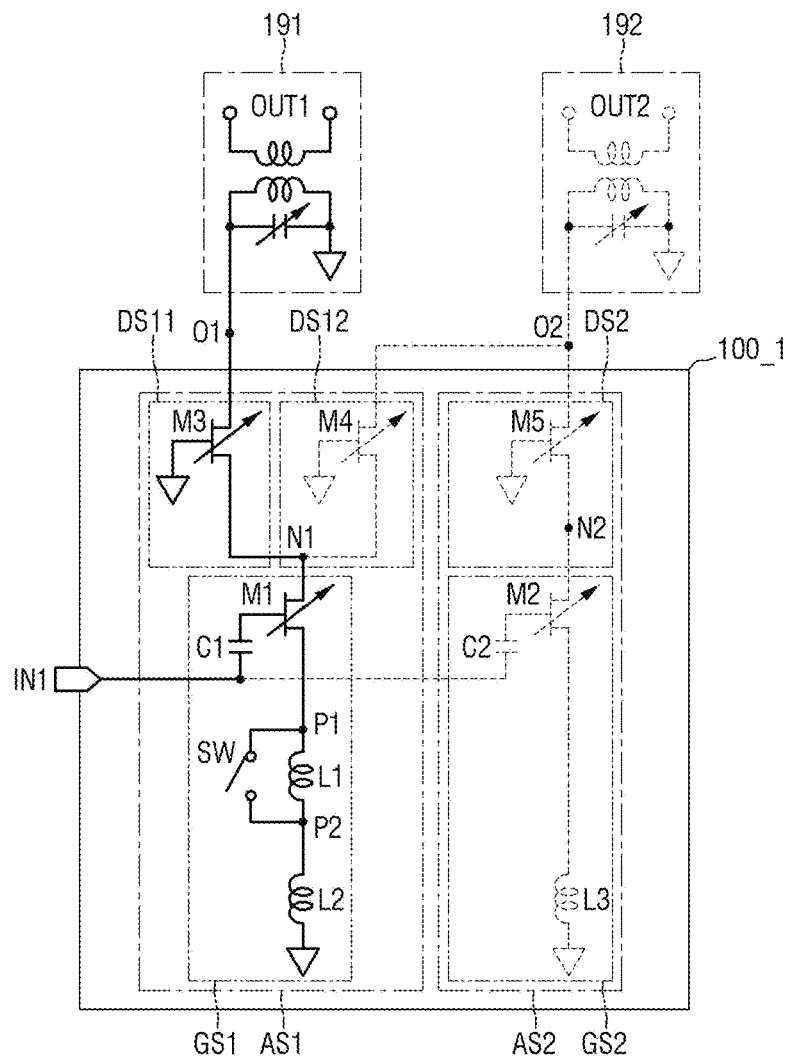
FIGS. 6A to 6B illustrate an operation mode in inter-band carrier aggregation.
Figure 6B:
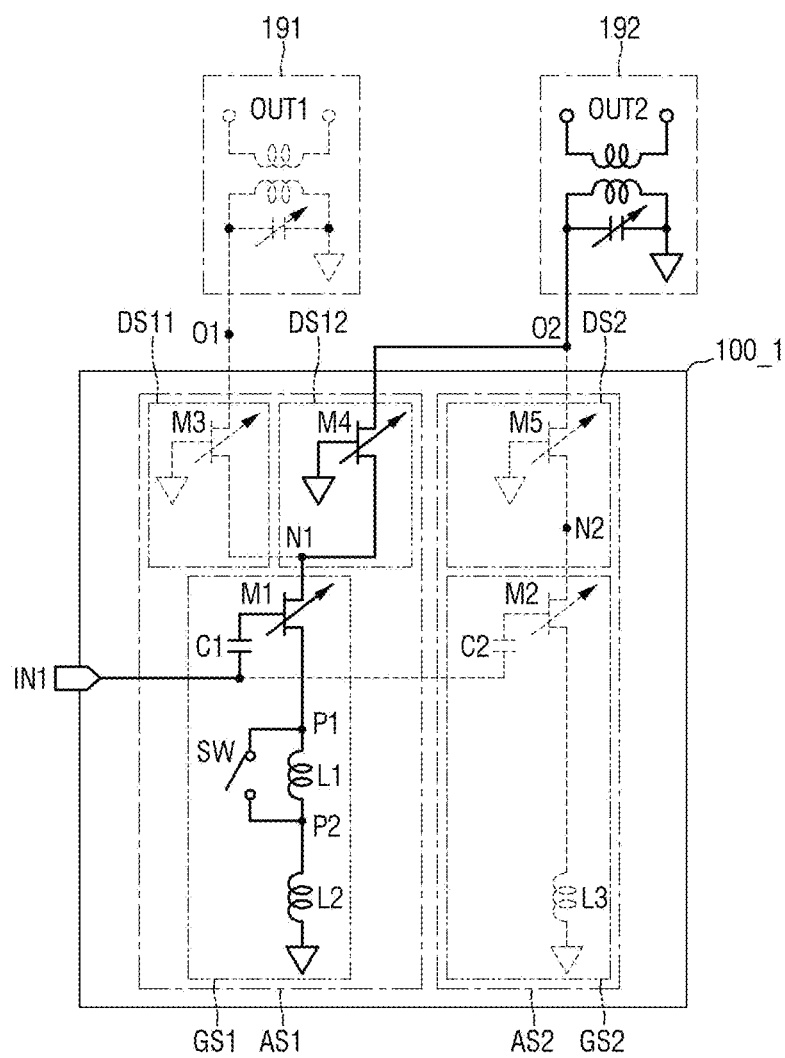
Figure 7:
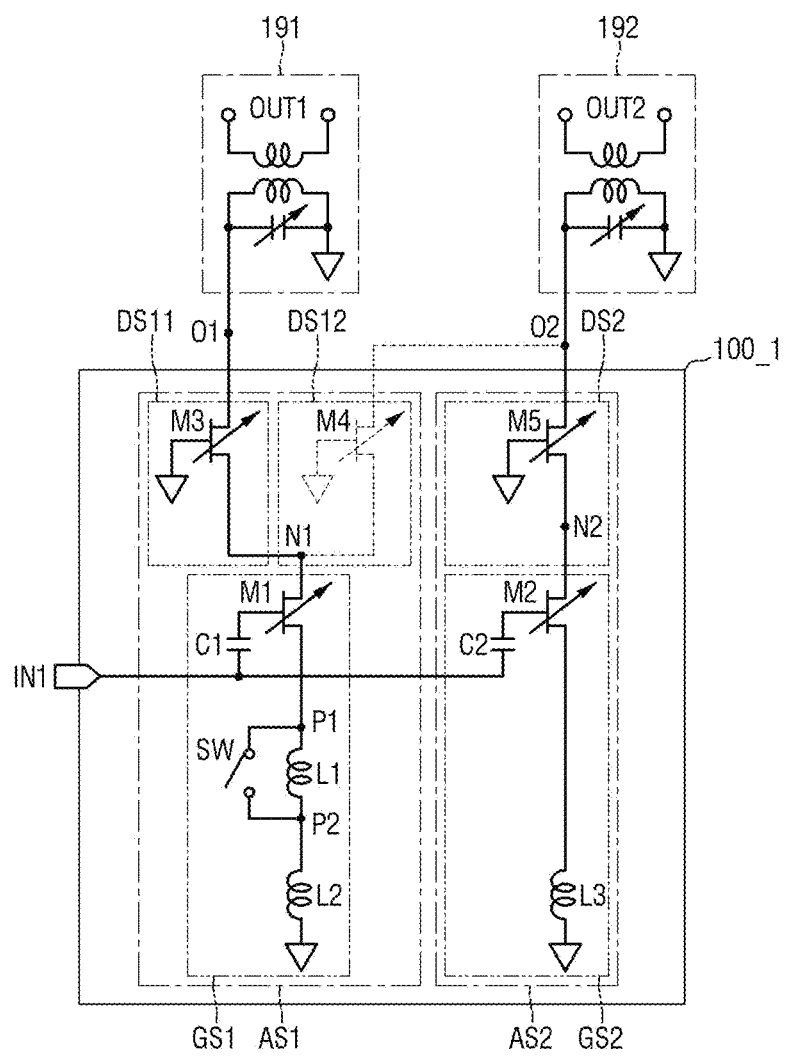
FIG. 7 illustrates an operation mode in non-contiguous intra-band carrier aggregation.

FIGS. 6A to 7 are views of an LAN 100 having the same structure, illustrating operation states of the LNA according to an operation mode, wherein elements and lines that are enabled in relation to the amplification of an input signal are denoted by solid lines and disabled elements and lines are denoted by dotted lines. FIGS. 6A to 6B illustrate an operation mode in inter-band carrier aggregation. FIG. 7 illustrates an operation mode in non-contiguous intra-band carrier aggregation.

FIGS. 6A and 6B are circuit diagrams for describing a first operation mode of an LNA 100-1 according to some example embodiments.

According to some example embodiments, in the example of an inter-band carrier aggregation mode (e.g., in FIGS. 2AA and 2AB), a mode signal MD activates only one of enable signals EN1 and EN2. In order to enable one gain stage, a first enable signal EN1 may have a logic value different from that of a second enable signal EN2. For example, in the example of an inter-band carrier aggregation mode, an amplifier stage AS1 may be enabled, an amplifier stage AS2 may be disabled, and a switch SW connected to both ends of a degeneration inductor L1 may be turned off.

Referring to FIG. 6A, when the LNA 100-1 receives a first input signal IN1, a first gain stage GS1 transmits the first input signal to a drive stage DS11 through an input transistor M1 connected to an input port. The drive stage DS11 drives the first input signal through a cascode transistor M3 connected to a first output port to output it to a first load circuit Load circuit 1 as a first output signal OUT1.

Referring to FIG. 6B, when the LNA 100-1 receives a first input signal IN1, the first gain stage GS1 transmits the first input signal to a drive stage DS12 through the input transistor M1 connected to the input port. The drive stage DS12 drives the first input signal through a cascode transistor M4 connected to a second output port to output it to a second load circuit Load circuit 2 as a second output signal OUT1.

A bias signal may be controlled to be applied or not to be applied to gates of the cascode transistors M3 and M4 according to the operation mode so that the cascode transistors M3 and M4 may be enabled or disabled.

FIG. 7 is a circuit diagram for describing a second operation mode of the LNA according to some example embodiments.

According to some example embodiments, in the example of a non-continuous intra-band carrier aggregation mode (e.g., in FIGS. 2CA and 2CB), a mode signal MD enables all amplifier stages through enable signals EN1 and EN2. In order to enable all gain stages, a first enable signal EN1 and a second enable signal EN2 may have the same logic value. For example, in the example of a non-continuous intra-band carrier aggregation mode, an amplifier stage AS1 and an amplifier stage AS2 may be enabled, and a switch SW connected to both ends of a degeneration inductor L1 may be turned on.

Referring to FIG. 7, when the LNA 100-1 receives an input signal, a first gain stage GS1 transmits the input signal to a drive stage DS11 through an input transistor M1 connected to an input port IN1. The drive stage DS11 drives the input signal through a cascode transistor M3 to output it as a first output signal OUT1 to a first load circuit Load circuit 1 connected to an output port O1.

When the LNA 100-1 receives an input signal, a second gain stage GS2 transmits the input signal to a drive stage DS2 through an input transistor M2 connected to the input port IN1. The drive stage DS2 drives the input signal through a cascode transistor M5 to output it as a second output signal OUT2 to a second load circuit Load circuit 2 connected to an output port O2.

In the non-continuous intra-band carrier aggregation mode, for example, a combined impedance of the input transistor M1 and the input transistor M2 may be halved compared to the impedance when only the input transistor M1 operates in the inter-band carrier aggregation mode. In some example embodiments, even when current in a first current path through the first amplifier stage AS1 and current in a second current path through the second amplifier stage AS2 are set to be the same as in the inter-band carrier aggregation mode, a gain of the amplifier stage AS1 may be the same as that in example embodiments of operating in the inter-band carrier aggregation mode as long as the switch SW is turned on to bypass the degeneration transistor L1 and to allow only the degeneration transistor L2 to operate.

Figure 8A:
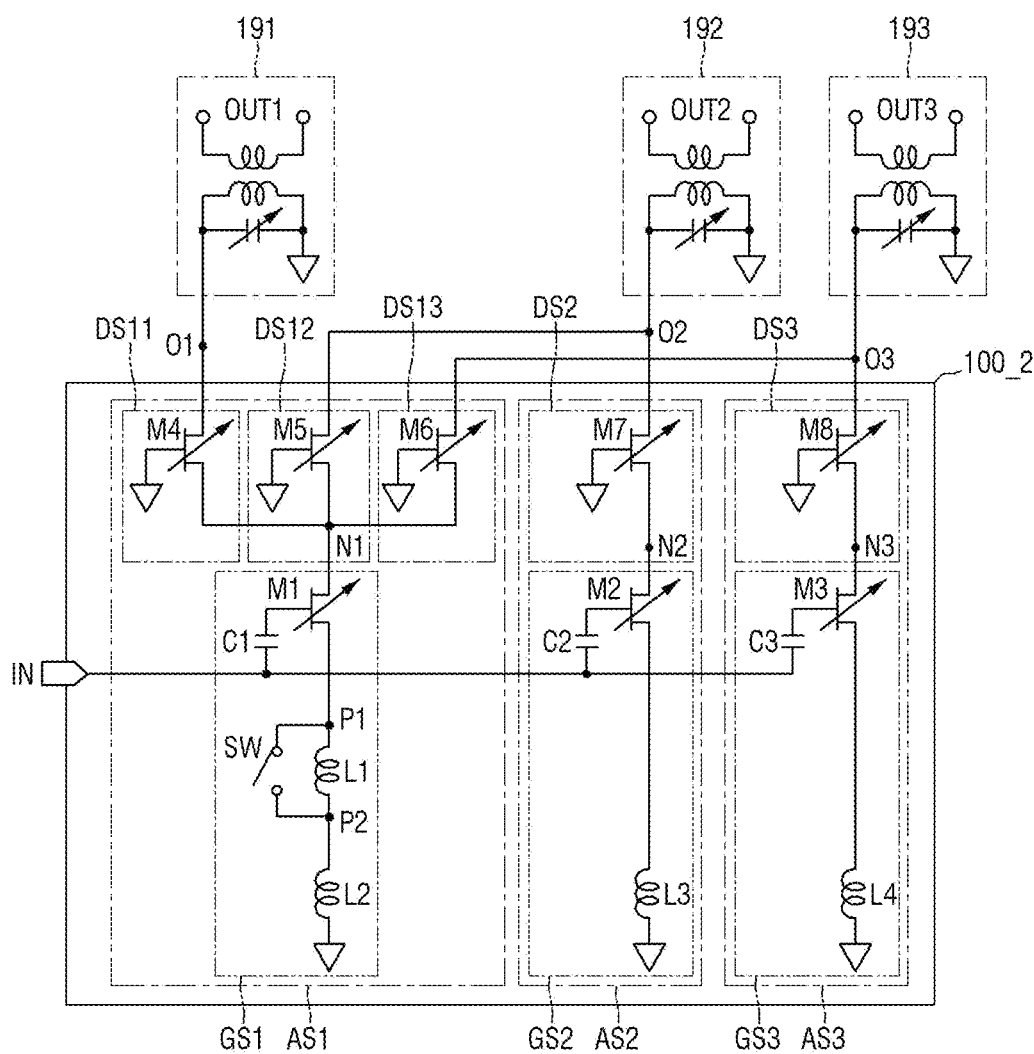
FIG. 8A is a circuit diagram of an LNA according to some example embodiments.
Figure 8B:
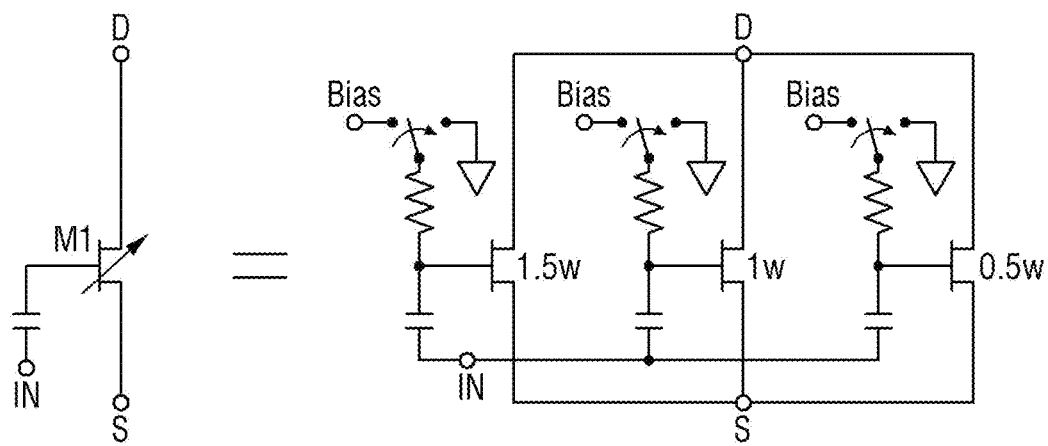
FIGS. 8B and 8C illustrate equivalent circuits of an input transistor shown in FIG. 8A.
Figure 8C:
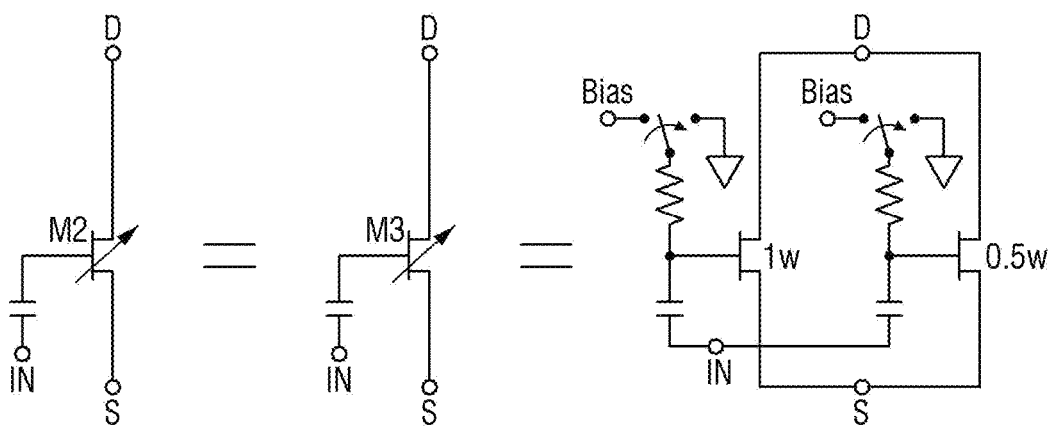

FIG. 8A is a circuit diagram of an LNA according to some example embodiments, and FIGS. 8B and 8C illustrate equivalent circuits of an input transistor shown in FIG. 8A.

Referring to FIG. 8A, an LNA connected to three load circuits is illustrated. An LNA 100-2 may include three amplifier stages AS1, AS2, and AS3.

According to some example embodiments, the LNA 100-2 may include a first type amplifier stage AS1 and second type amplifier stages AS2 and AS3. For example, the first type amplifier stage AS1 may include one gain stage GS1 and a plurality of first type drive stages DS11, DS12, and DS13. For example, each of the second type amplifier stages AS2 and AS3 may include one gain stage (GS1 in AS2 and GS3 in AS3) and one second type drive stage (DS2 in AS2 and DS3 in AS3).

According to some example embodiments, the first type gain stage GS1 includes an input transistor M1, an input capacitor C1, and/or degeneration inductors L1 and L2. The input transistor M1 is connected between one end of the degeneration inductor L1 and an input terminal of the drive stage DS1 and the input capacitor C1 is connected between the input port IN1 and a gate of the input transistor M1. When an input signal IN is applied, the input signal passes through the input capacitor C1 and the input transistor M1 operates. A signal amplified according to the transconductance of the input transistor M1 and impedance of the degeneration inductors L2 and L1 is output to the first type drive stage DS11, the first type drive stage DS12, and the first type drive stage DS13.

The degeneration inductors L2 and L1 are connected in series between a ground terminal and one end of the input transistor M1. Since the description of the degeneration inductors L2 and L1 is redundant to FIGS. 4 and 5, and thus it will be omitted.

According to some example embodiments, the first type drive stages DS11, DS12, and DS13 may include cascode transistors M4, M5, and M6, respectively. According to some example embodiments, the number of cascode transistors may correspond to the number of load circuits 191, 192, and 193. For example, the drive stage DS11 includes the cascode transistor M4 connected between one end of the input transistor M1 and an output port O1 for the load circuit 191. The drive stage DS12 includes the cascode transistor M5 connected between one end of the input transistor M1 and an output port O2 for the load circuit 192. The drive stage DS13 includes the cascode transistor M6 connected between one end of the input transistor M1 and an output port O3 for the load circuit 193.

According to some example embodiments, the second type gain stage GS2 includes an input transistor M2, an input capacitor C2, and/or degeneration inductor L3. The input transistor M2 is connected between one end of the degeneration inductor L3 and an input terminal of the drive stage DS2 and the input capacitor C2 is connected between the input port IN1 and a gate of the input transistor M2. When the input signal is applied, the input signal passes through the input capacitor C2 and the input transistor M2 operates. A signal amplified according to the transconductance of the input transistor M2 and impedance of the degeneration inductor L3 is output to the drive stage DS2.

According to some example embodiments, when a gate voltage is non-inverted, transistors of the input transistor M1 and the cascode transistors M4, M5, and M6 are enabled, and when the gate voltage is inverted, the transistors may be disabled. The input transistor M1 and the cascode transistors M4, M5, and M6, which are variable transistors, may amplify the received input signal with a varied impedance according to settings and output the amplified input signal to the output ports O1, O2, and O3.

Figure 9A:
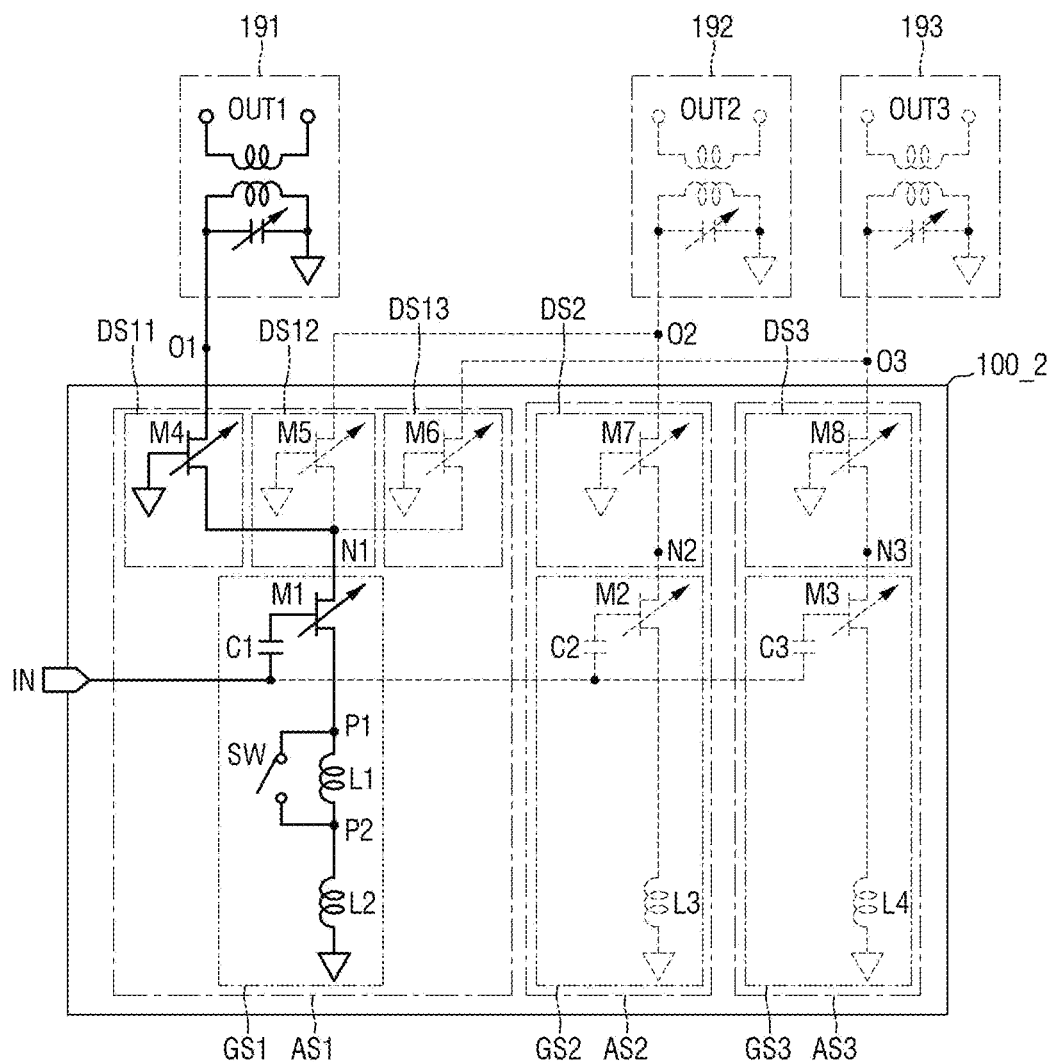
FIG. 9A is a circuit diagram illustrating the LNA 100-2 in an inter-band carrier aggregation mode or non-carrier aggregation mode.
Figure 9B:
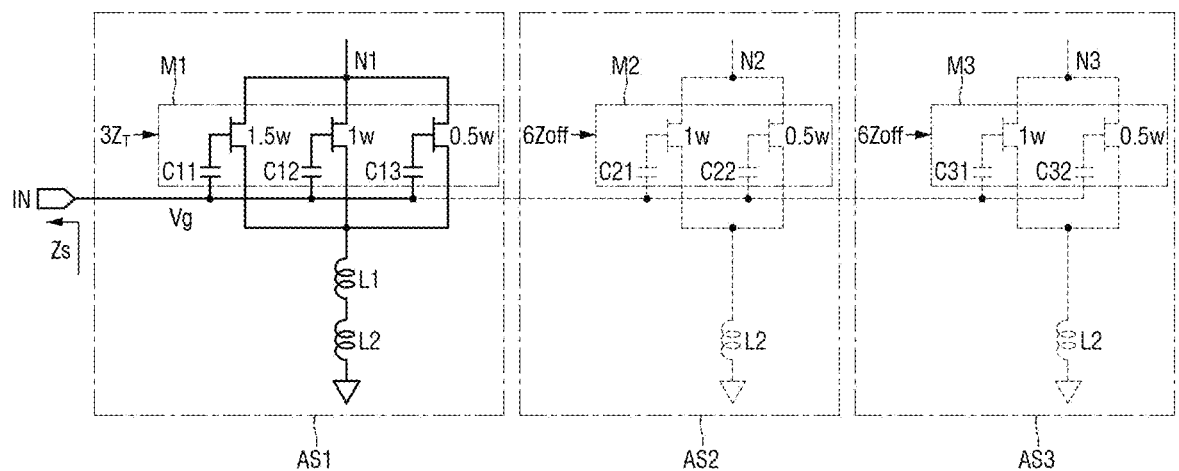
FIGS. 9B and 9C illustrate a circuit state and an equivalent circuit of the LNA in the inter-band carrier aggregation mode or non-carrier aggregation mode.
Figure 9C:
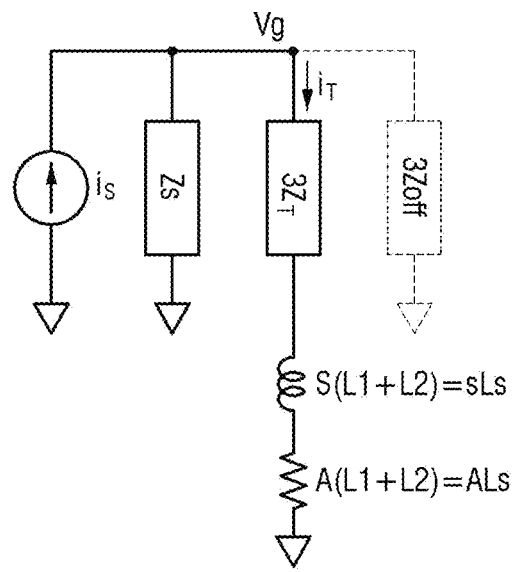

Referring to FIGS. 8B and 9C, according to some example embodiments, the input transistors M1, M2, and M3 may include a plurality of transistors. In the plurality of transistors, each gate is connected to the input port In and a variable switch, and the variable switch may be turned on or turned off according to the operation mode to vary the impedance of each input transistor.

Referring to FIG. 8B, the input transistor M1 may include a plurality of transistors (three in the illustrated example) each having a different impedance. For example, the three transistors may have impedances of 1.5 w, 1 w, and 0.5 w, respectively, when turned on by applying a bias to their gate connected to the variable switch. For example, the input transistor M1 may have a combined impedance varied to one of 0.5 w, 1 w, 1.5 w, 2.0 w, 2.5 w, and 3 w according to turning on/off of the variable switch. However, this is merely an impedance value assumed for convenience of description, and it should be noted that the impedance value is variable within the technical spirit of the inventive concepts and equivalents thereof.

According to some example embodiments, the second type drive stage DS2 includes a cascode transistor M7 connected between one end N2 of the input transistor M2 and the output port O2 for the load circuit 192. According to some example embodiments, the input transistor M2 and the cascode transistor M7, which are variable transistors, may amplify the received input signal with a varied impedance according to settings and output the amplified input signal to the output port O2.

According to some example embodiments, the second type drive stage DS3 includes a cascode transistor M8 connected between one end N3 of the input transistor M3 and the output port O3 for the load circuit 193. According to some example embodiments, the input transistor M3 and the cascode transistor M8, which are variable transistors, may amplify the received input signal with a varied impedance according to settings and output the amplified input signal to the output port O3.

Referring to FIG. 8C, the input transistor M2 may include a plurality of transistors (two in the illustrated example) each having a different impedance. For example, the two transistors may have impedances of 1.5 w and 0.5 w, respectively, when turned on by applying a bias to their gate connected to the variable switch. For example, the input transistor M2 and M3 may have a combined impedance varied to one of 0.5 w, 1.5 w, and 2.0 w according to turning on/off of the variable switch. However, this is merely an impedance value assumed for convenience of description, and it should be noted that the impedance value is variable within the technical spirit of the inventive concepts and equivalents thereof.

According to some example embodiments, although the input transistors M1, M2, and M3 operate in various operation modes, the LNA may have a uniform input impedance and a uniform parasitic impedance by adjusting the impedance of each of the input transistors using the variable switch. FIGS. 9A to 11C are diagrams for describing the operation mode of the LNA 100-2 according to some example embodiments and a change in a variable input impedance.

FIG. 9A is a circuit diagram illustrating the LNA 100-2 in an inter-band carrier aggregation mode or non-carrier aggregation mode, and FIGS. 9B and 9C illustrate a circuit state and an equivalent circuit of the LNA in the inter-band carrier aggregation mode or non-carrier aggregation mode.

Referring to FIG. 9A, in the LNA 100-2, a gate voltage of an amplifier stage AS1 may be non-inverted and operates, and gate voltages of the remaining amplifier stages AS2 and AS3 may be inverted and not operate. In order to operate in an inter-band carrier aggregation mode, one of three cascode transistors M4, M5, and M6 may be enabled and the other cascode transistors may be disabled. For example, in order for the LNA 100-2 to output an input signal, which is received through an input port IN, to a load circuit 191, the cascode transistor M4 may be turned on with a non-inverted gate voltage and the cascode transistors M5 and M6 may be turned off with an inverted gate voltage. In addition, unlike the intra-band carrier aggregation mode to be described below with reference to FIG. 10A or 110A, compensation due to gain degradation is not required to be made, and thus the LNA 100-2 may allow current to flow to an inductor L1 by turning off a switch SW.

Meanwhile, the load circuit 192 and cascode transistors M7 and M8 connected to the load circuit 193 may be turned off with a non-inverted gate voltage. That is, the cascode transistors M4 to M8 may be independently controlled.

Referring to FIG. 9A, the amplifier stage AS1 may output an output signal OUT1 by amplifying the input signal IN, and the amplifier stages AS2 and AS3 are disabled so that an output signal of each of the amplifier stages AS2 and AS3 may be in a floating state (or a high-impedance state). Accordingly, as shown in FIGS. 9B and 9C, the input transistor M1 may have the variable impedance described with reference to FIGS. 8B and 8C. For example, it is assumed that the impedance when a transistor of 1 w is enabled is defined as $Z_T$, the impedance when a transistor of 0.5 w is disabled is defined as Zoff, and impedances of degeneration inductors L1 and L2 are negligible. In some example embodiments, a variable impedance of the turned-on input transistor M1 may be $3Z_T$ (3 w=1.5 w+1 w+0.5 w), a variable impedance of the turned-off input transistor M2 may be Zoff, a variable impedance of the input transistor M3 may also be Zoff, and an input impedance Zin of the LNA may be Zin=3$Z_T$//3Zoff.

Figure 10A:
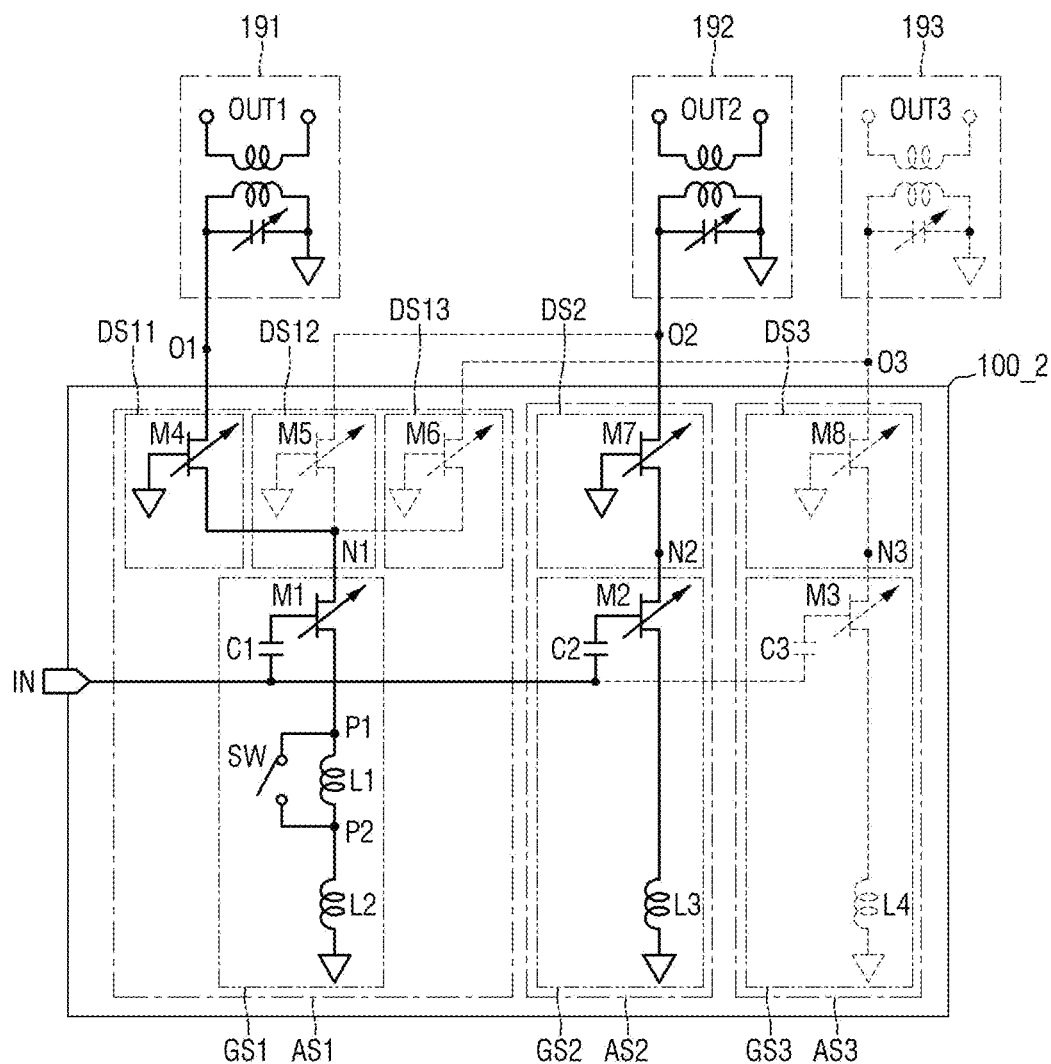
FIG. 10A is a circuit diagram of an LNA 100-2 in a 2-channel non-contiguous intra-band carrier aggregation mode.
Figure 10B:
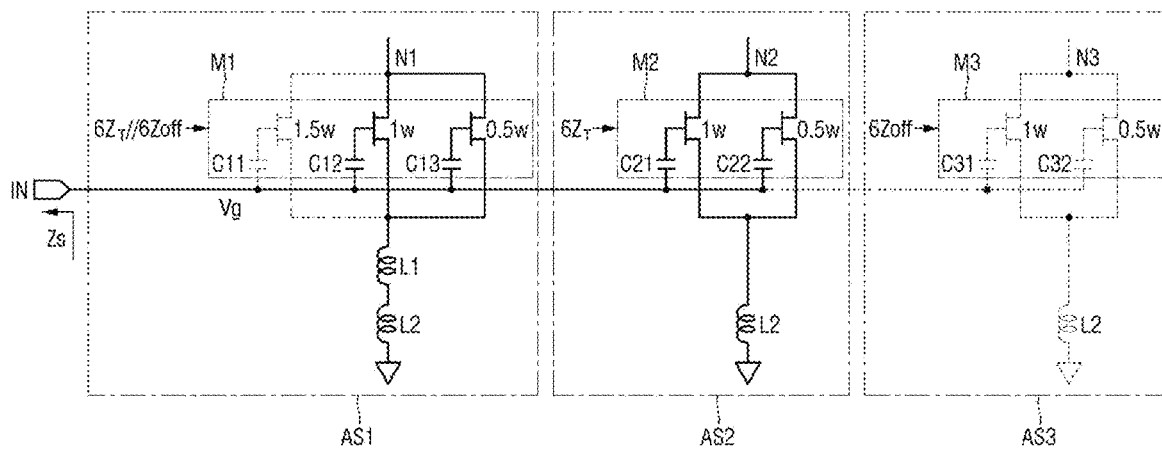
FIGS. 10B and 10C illustrate a circuit state and an equivalent circuit of the LNA of FIG. 10A.
Figure 10C:
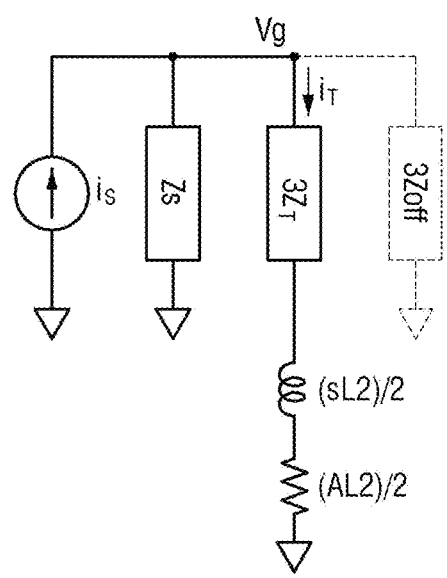

FIG. 10A is a circuit diagram of an LNA 100-2 in a 2-channel non-contiguous intra-band carrier aggregation mode, and FIGS. 10B and 10C illustrate a circuit state and an equivalent circuit of the LNA of FIG. 10A. In the 2-channel non-contiguous intra-band carrier aggregation (hereinafter referred to as "non-continuous 2CA") mode, since two frequency channels must be arranged in the same bands, the LNA 100-2 is required to output two adjacent output signals by amplifying one input signal.

Referring to FIG. 10A, in order to operate in the non-contiguous 2CA mode, two of the amplifier stages AS1, AS2, and AS3 may be enabled so that two load circuits may simultaneously receive an output signal. In the LNA 100-2, gate voltages of the amplifier stages AS1 and AS2 may be non-inverted and operate, and a gate voltage of the amplifier stage AS3 may be inverted and not operate. In order to operate in the non-continuous 2CA mode, only one of three cascode transistors M4, M5, and M6 and a cascode transistor M7, or only one of the three cascode transistors M4, M5, and M6 and a cascode transistor M8, may be enabled, and the remaining cascode transistors may be disabled. For example, in order for the LNA 100-2 to output an input signal, which is received through an input port IN, to a load circuit 191, the cascode transistors M4 and M7 may be turned on with a non-inverted gate voltage and the cascode transistors M5, M6, and M8 may be turned off with an inverted gate voltage.

Referring to FIG. 10A, the amplifier stage AS1 may output an output signal OUT1 by amplifying the input signal IN, and the amplifier stage AS2 may output an output signal OUT2 by amplifying the input signal IN, while the amplifier stage AS3 is disabled so that an output signal of the amplifier stage AS3 may be in a floating state (or a high-impedance state). Referring to FIGS. 10B and 10C, for example, a variable impedance of the turned-on input transistor M1 may be 1.5$Z_T$ (1.5 w=1.0 w+0.5 w). A variable impedance of the turned-on input transistor M2 may be 1.5$Z_T$ (1.5 w=1.0 w+0.5 w). In some example embodiments, the input transconductance of the transistors included in the amplifier stages AS1 and AS2 may be reduced compared to that of the input transistor M1 of the amplifier stage AS1 in the inter-band carrier aggregation in FIGS. 9A to 9C. For example, when current applied to each amplifier stage is set to $i_T$ as in FIGS. 9A to 9C, the combined transconductance is reduced, and thus gain degradation may occur compared to the inter-band carrier aggregation mode. To this end, the switch SW is turned on to bypass the current, so that the current is reduced or prevented from flowing through an inductor L1.

According to some example embodiments, a degeneration inductor L3 and a degeneration inductor L4 may have an inductance that is different from the combined inductance (L1+L2) of the amplifier stage AS1. For example, the degeneration inductor L3 and the degeneration inductor L4 have an inductance that is smaller than the combined inductance (L1+L2) of the amplifier stage AS1.

Therefore, an input impedance Zin may be Zin=3$Z_T$//3Zoff, which is connected in parallel with a turned-off parasitic impedance corresponding to the combined impedance (1.5 w+1.5 w) caused by the variation in the turned-on amplifier stages AS1 and AS2. In some example embodiments, it is assumed that the impedances of the degeneration inductors L2, L3, and L4 are negligible.

Figure 11A:
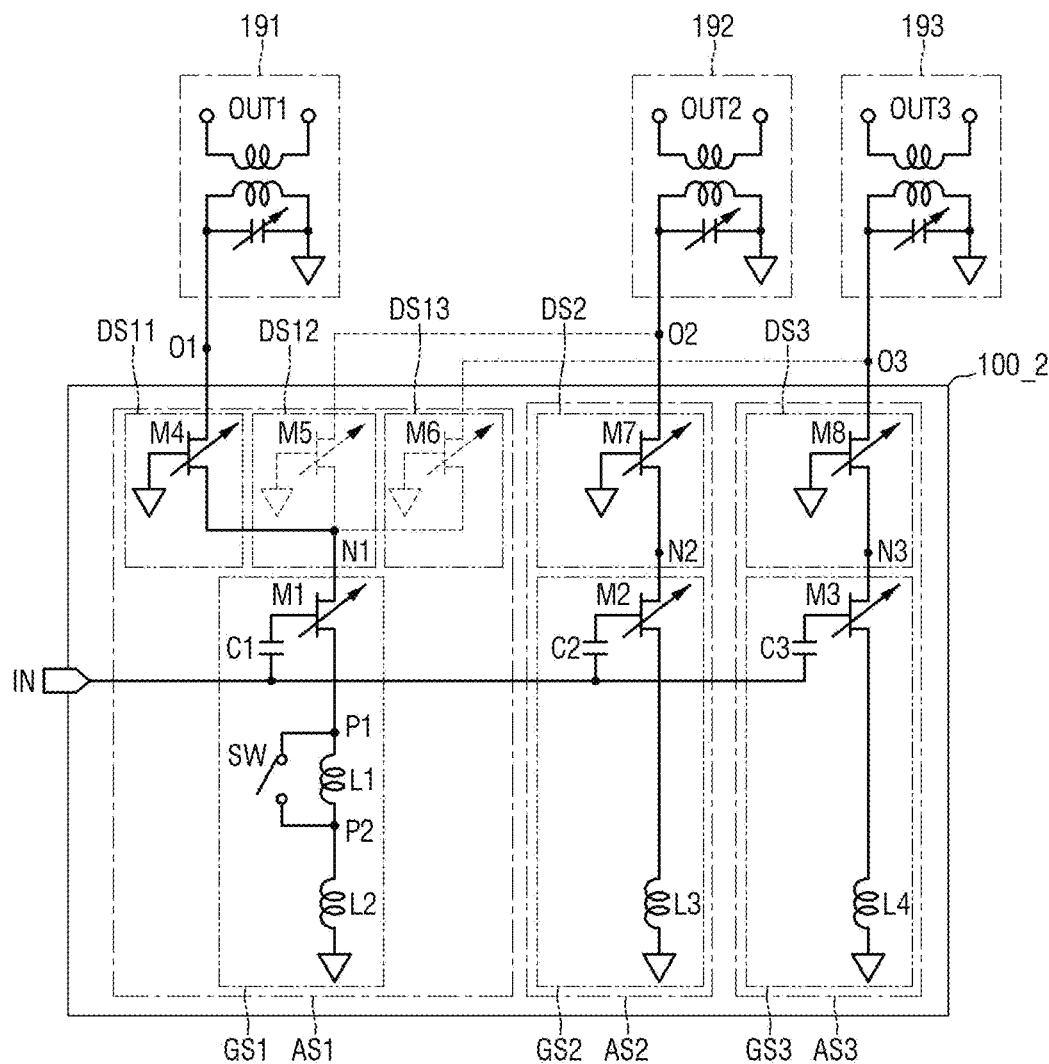
FIG. 11A is a circuit diagram of the LNA 100-2 in a 3-channel non-contiguous intra-band carrier aggregation mode.
Figure 11B:
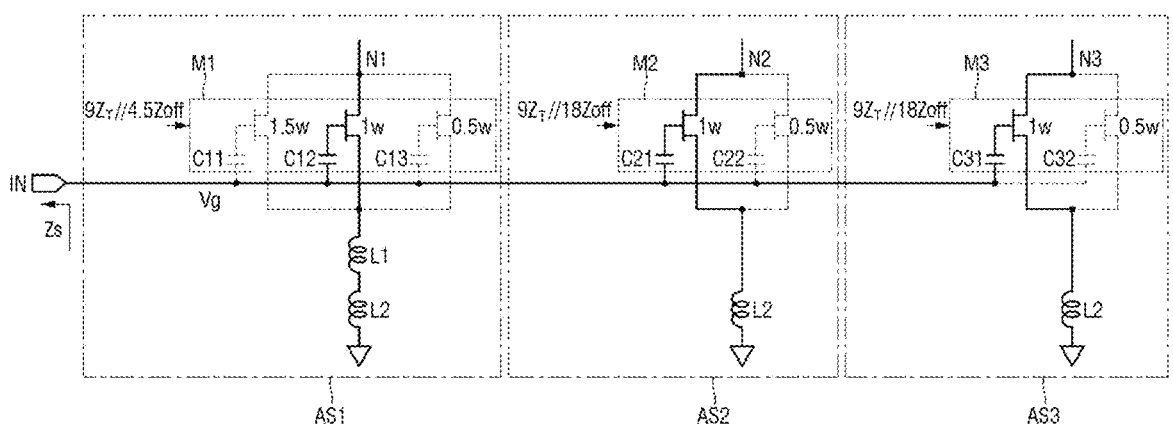
FIGS. 11B and 11C illustrate a circuit state and an equivalent circuit of the LNA of FIG. 11A.
Figure 11C:
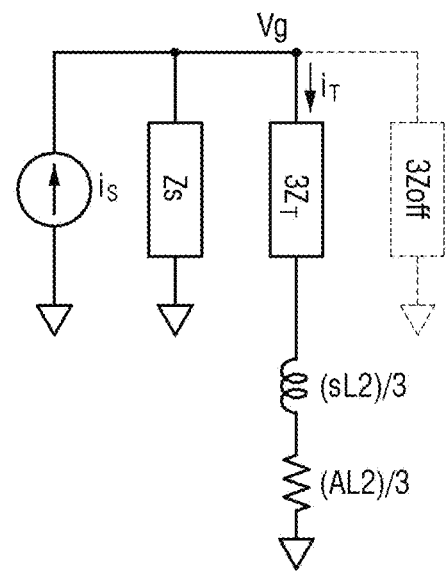

FIGS. 11A to 11C are diagrams for describing a third operation mode of the LNA 100-2 according to some example embodiments. FIG. 11A is a circuit diagram of the LNA 100-2 in a 3-channel non-contiguous intra-band carrier aggregation mode, and FIGS. 11B and 11C illustrate a circuit state and an equivalent circuit of the LNA of FIG. 11A. In the 3-channel non-contiguous intra-band carrier aggregation mode, the LNA 100-2 is required to output three output signals by amplifying one input signal.

Referring to FIG. 11A, in order to operate in the 3-channel non-contiguous intra-band carrier aggregation mode, all amplifier stages AS1, AS2, and AS3 are enabled so that three load circuits may simultaneously receive an output signal. In the LNA 100-2, gate voltages of the amplifier stages AS1, AS2, and AS3 may be non-inverted and operate. In order to operate in the non-contiguous intra-band carrier aggregation mode, one of three cascode transistors M4, M5, and M6 in the amplifier stage AS1 may be enabled and the cascode transistor M7 of the amplifier stage AS2 and the cascode transistor M8 of the amplifier stage AS3 may also be turned on. For example, in order for the LNA 100-2 to simultaneously output an input signal, which is received through an input port IN, to load circuits 191, 192, and 193, the cascode transistors M4, M7, and M8 may be turned on with a non-inverted gate voltage and the cascode transistors M5 and M6 may be turned off with an inverted gate voltage.

Referring to FIG. 11A, by amplifying the input signal IN, the amplifier stage AS1 outputs an output signal OUT1, the amplifier stage AS2 outputs an output signal OUT2, and the amplifier stage AS3 outputs an output signal OUT3. Referring to FIGS. 11B and 11C, for example, a variable impedance of the turned-on input transistor M1 is 1$Z_T$ (1.0 w), a variable impedance of the input transistor M2 is 1$Z_T$ (1 w), a variable impedance of the input transistor M3 is 1$Z_T$ (1 w), and an input impedance Zin may be Zin=3$Z_T$//3Zoff connected in parallel with the combined impedance of a turned-off parasitic impedance.

In some example embodiments, the input transconductance of the transistors included in the amplifier stage AS1 may be reduced compared to that of the input transistor M1 of the amplifier stage AS1 in the inter-band carrier aggregation. Accordingly, the switch SW is turned on to bypass the current, so that the current is reduced or prevented from flowing through an inductor L1.

Figures 12, 13:
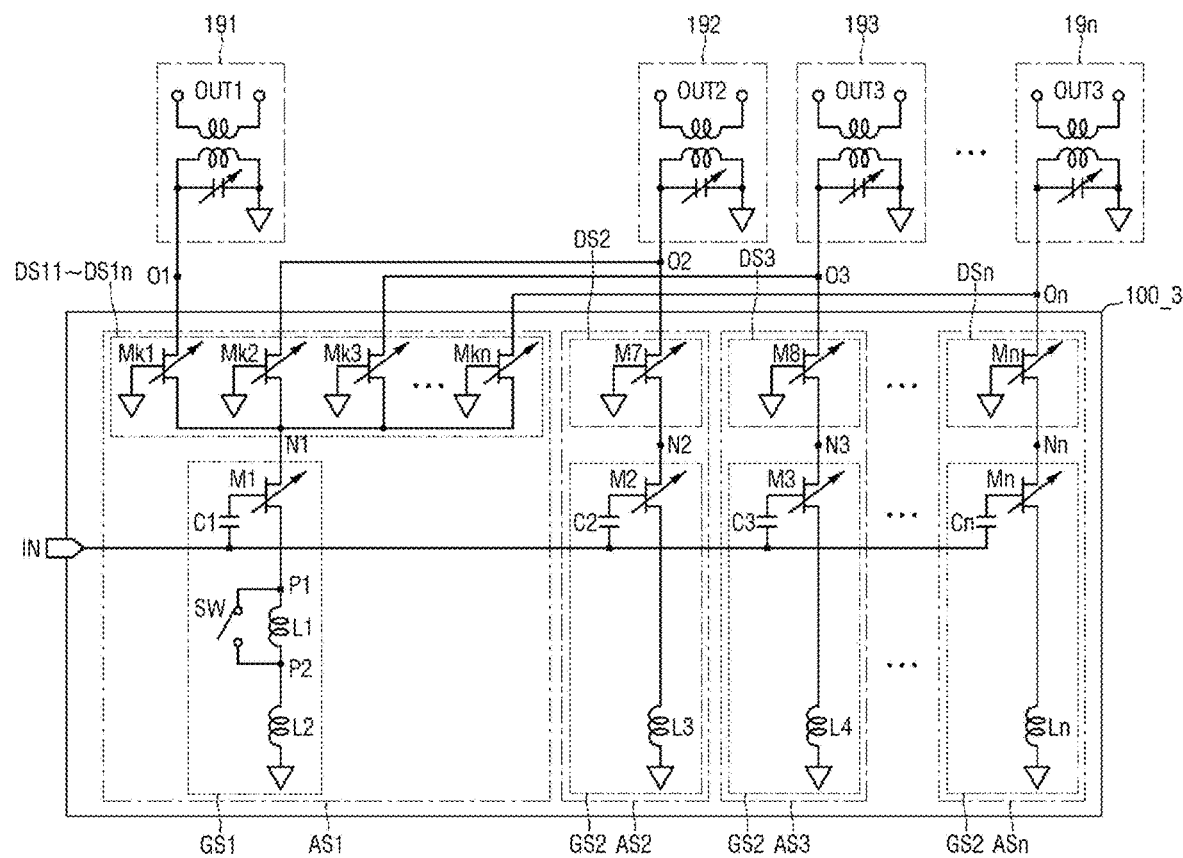
FIG. 12 is a table illustrating widths of input transistors according to the operation modes of the LNA according to some example embodiments.
FIG. 13 is a circuit diagram of an LNA according to some example embodiments.

FIG. 12 is a table illustrating widths of input transistors according to the operation modes of the LNA according to some example embodiments.

Referring to FIG. 12 in conjunction with FIGS. 9C, 10C, and 11C, $sL_S$, $AL_S$, sL2, and AL2 in an equivalent circuit of the LNA according to some example embodiments are smaller than 3$Z_T$ and thus negligible. Thus, an input impedance of the LNA 100-2 is maintained almost uniform at 3$Z_T$ in any operation mode, such as the inter-band carrier aggregation mode, the non-contiguous 2CA, or the 3-channel non-contiguous intra-band carrier aggregation mode. In addition, it can be seen that a parasitic impedance Zoff caused by the turned-off transistors is maintained uniform at 3Zoff in each of the operation modes (the inter-band carrier aggregation mode, the non-contiguous 2CA, and the 3-channel non-contiguous intra-band carrier aggregation mode).

FIG. 13 is a circuit diagram of an LNA according to some example embodiments.

Referring to FIG. 13, a plurality of load circuits may be provided. For example, three or more load circuits may be provided. When n (n is a natural number greater than or equal to 1) load circuits are included, an LNA 100-3 may include n amplifier stages AS1 to ASn.

One amplifier stage AS1 of the n amplifier stages AS1 to ASn may include a first type gain stage GS1 and first type drive stages DS1 to DS1n, and the remaining amplifier stages may include second type gain stages and second type drive stages.

According to some example embodiments, the first type gain stage GS1 may include an input capacitor C1 and two or more degeneration inductors L1 and L2 connected in series with an input transistor M1. One (e.g., L1, which will be referred to as a compensation degeneration inductor) of the degeneration inductors L1 and L2 has both ends connected to a switch SW, and the switch SW is turned on according to the operation mode, so that current is bypassed without passing through the compensation degeneration inductor L1. The first type drive stage DS1 may include a number of sub-drive stages DS11 to DS1n corresponding to the number of load circuits. For example, when there are n (n is a natural number greater than or equal to 2) load circuits, n cascode transistors Mk1 to Mkn may be provided to be connected to the load circuits, respectively. The n cascode transistors Mk1 to Mkn may be connected in parallel between an output terminal of the first type gain stage and each of the load circuits 191 to 19n.

The second type gain stages GS2 to GSn may each include one input capacitor, one input transistor, and one second degeneration inductor according to some example embodiments. For example, the gain stage GS2 may include an input transistor M2, an input capacitor C2, and a degeneration inductor L2. The second type drive stage includes one cascode transistor. For example, a drive stage DS2 may include a cascode transistor M7.

An LNA 100-3 according to some example embodiments may vary impedances of the input transistors M1, M2, . . . , and Mn such that the input impedance Zin is uniform in all operation modes including the inter-band carrier aggregation mode or the intra-band carrier aggregation mode. According to some example embodiments, the input transistors M1, M2, . . . , and Mn may vary the impedance such that the input impedance Zin is uniform and a parasitic impedance Zoff is also uniform.

The LNA 100-3 according to some example embodiments may operate by enabling amplifier stages AS1 to ASn according to the number of channels to be used in the band when operating in the intra-band carrier aggregation mode. When operating in the inter-band carrier aggregation mode, the switch SW is turned off, but in the intra-band carrier aggregation mode, the switch is turned on to compensate for a degraded gain.

Figure 14:
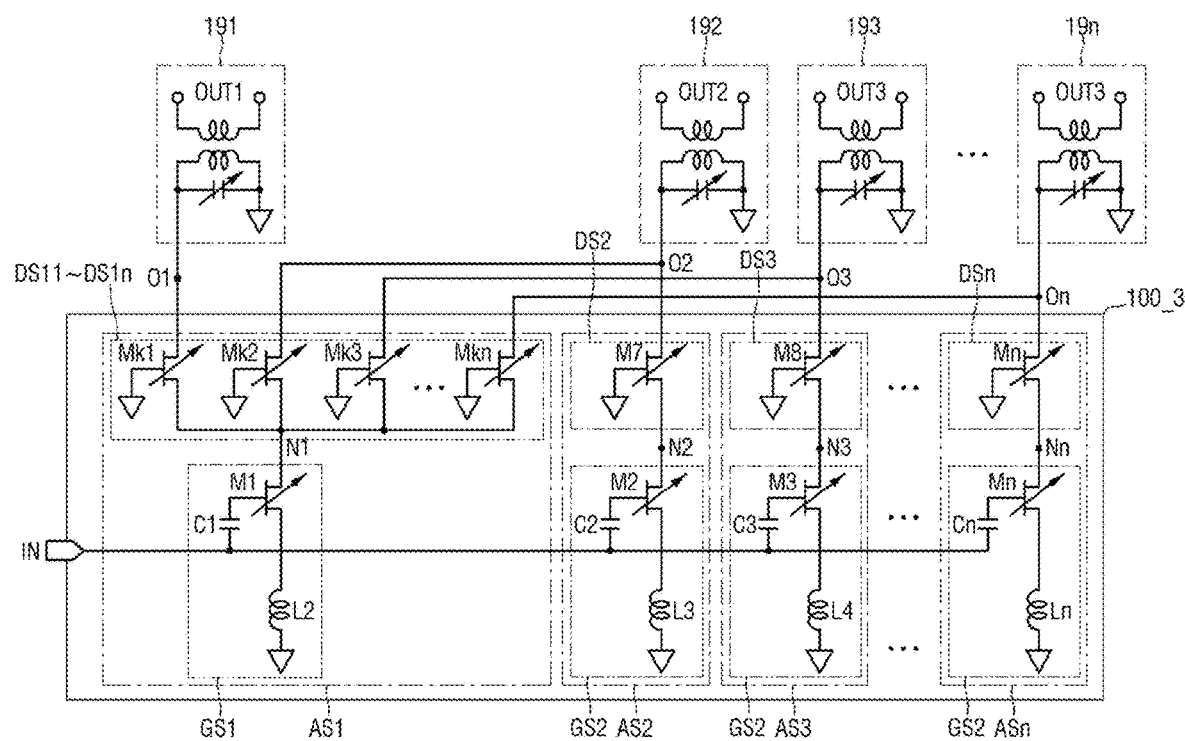
FIG. 14 is a circuit diagram of an LNA according to some example embodiments.

FIG. 14 is a circuit diagram of an LNA according to some example embodiments. For simplicity, description redundant to FIG. 13 will be omitted.

Referring to FIG. 14, according to some example embodiments, a plurality of load circuits may be provided. For example, three or more load circuits may be provided. When n (n is a natural number greater than or equal to 1) load circuits are included, an LNA 100-3 may include n amplifier stages AS1 to ASn.

One amplifier stage AS1 of the n amplifier stages AS1 to ASn may include a first type gain stage GS1 and first type drive stages DS1 to DS1n, and the remaining amplifier stages AS2 to ASn may include second type gain stages and second type drive stages. However, unlike the example shown in FIG. 13, the first type gain stage GS1 does not include a switch, and may include an input capacitor C1, an input transistor M1, and a degeneration inductor L2. That is, the first type gain stage GS1 may include the same components as those of the second type gain stage (e.g., GS2).

However, an LNA 100-3 according to example embodiments of FIG. 14 may vary impedances of the input transistors M1, M2, . . . , and Mn such that the input impedance Zin is uniform in all operation modes including the inter-band carrier aggregation mode or the intra-band carrier aggregation mode. According to some example embodiments, the input transistors M1, M2, . . . , and Mn may vary the impedance such that the input impedance Zin is uniform and a parasitic impedance Zoff is also uniform.

FIG. 15 is a view illustrating an example of a receiver including an LNA according to some example embodiments. As described above with reference to FIG. 1, LNAs 100 of FIG. 15 may provide output signals OUTs through a plurality of lines by amplifying input signals INs through a plurality of lines, and load circuits 14 may provide a receiver output signal RX_OUT from the plurality of output signals OUTs.

Referring to FIG. 15, the LNAs 100 may include k LNAs LNA1 to LNAk (k is an integer greater than 1). The k LNAs LNA1 to LNAk may receive k input signals IN1 to INk, respectively. Each of the k LNAs LNA1 to LNAk may have a similar structure to that of the LNAs described above, in which three output signals are provided from one input signal. Outputs of the k LNAs LNA1 to LNAk may be connected to each other.

The load circuits 14 may include baluns 210, mixers 220, filters 230, and buffers 240 as illustrated in FIG. 15. The baluns 210 may convert one phase output signal provided from the LNAs 100 into a differential phase signal, and provide the differential signal to the mixers 220. For example, as illustrated in FIG. 15, the baluns 210 may include transformers, and each of the transformers may include a primary coil to which one phase signal is applied and a secondary coil which outputs a differential phase signal.

The mixers 220 may down-convert differential signals provided from the baluns 210. For example, the mixers 220 may receive vibration signals LO1 to LO3 corresponding to frequencies of carrier signals, and may move the differential signals provided from the baluns 220 to a baseband based on the vibration signals LO1 to LO3. The filters 230 may remove unnecessary frequency components by filtering the signals moved to the baseband.

The buffers 240 may provide the receiver output signal RX_OUT by amplifying the filtered signals to a predetermined or alternatively, desired gain. As described above, each of the k LNAs may operate differently according to an operation mode, and may be designed to reduce variations of an input impedance according to the operation mode. A ratio of the input signals INs to the receiver output signal RX_OUT, that is, an overall gain, may be changed in each of operation modes, and the buffers 240 may compensate for variations of overall gain per such an operation mode. That is, a gain of the buffer included in the buffers 240 may be varied based on the mode signal MD provided from the controller 300 of FIG. 1. For example, each of the buffers included in the buffers 240 may include a variable resistor, and the gain of the buffer may be changed by changing a resistance of the variable resistor based on the mode signal MD. Accordingly, even though the operation mode of the LNA, that is, the setting of the carriers is changed, the receiver output signal RX_OUT may have a constant magnitude.

In example embodiments, each of elements described above may be and/or include, for example, processing circuitry such as hardware, software, or the combination of hardware and software. For example, the processing circuitry more specifically may include (and/or be included in), but is not limited to, a processor (and/or processors), Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), graphics processing unit (GPU), etc.

Although example embodiments of the inventive concepts have been described with reference to the accompanying drawings, those skilled in the art will appreciate that various modifications and alterations may be made without departing from the spirit or essential feature of the inventive concepts. Therefore, it should be understood that the above-mentioned example embodiments are not restrictive but are exemplary in all aspects.

What is claimed:

1. A low noise amplifier comprising:
at least one input port configured to receive an input signal including a carrier;
first to third output ports connected to first to third load circuits, respectively, and configured to transmit an output signal;
a first amplifier stage comprising a first type gain stage connected to the input port and first to third first type drive stages connected to the first to third output ports, respectively; and
second to third amplifier stages, each comprising a second type gain stage and a second type drive stage,
wherein the low noise amplifier is configured to vary an impedance of an input transistor included in each of the first type gain stage and the second type gain stage, so that an input impedance is uniform even when operating in a plurality of operation modes.

2. The low noise amplifier of claim 1, wherein each of the first type gain stage and the second type gain stage comprises
an input capacitor having one end connected to the input port;
the input transistor having a gate connected to the other end of the input capacitance and one end connected to an input node of the first type drive stage; and
a first normal degeneration inductor connected between the other end of the input transistor and a ground terminal, and
the input transistor has an impedance varied according to the operation mode.

3. The low noise amplifier of claim 2, wherein the first type gain stage further comprises
a compensation degeneration inductor connected between the one end of the input transistor and the one end of the first normal degeneration inductor; and
a switch connected to both ends of the compensation degeneration inductor and configured to short circuit the compensation degeneration inductor when being turned on.

4. The low noise amplifier of claim 3, wherein a second normal degeneration inductance of each of the second type gain stages has an inductance that is different from a combined inductance of the first type gain stage.

5. The low noise amplifier of claim 2, wherein the low noise amplifier is configured to,
have a first input impedance and a first parasitic impedance according to first impedance settings of the input transistors in a first operation mode,
have a second input impedance and a second parasitic impedance according to second impedance settings of the input transistors in a second operation mode, and make the first input impedance and the first parasitic impedance the same as the second input impedance and the second parasitic impedance, respectively, by varying impedance settings from the first impedance settings to the second impedance settings.

6. The low noise amplifier of claim 2, wherein each of the first to third first type drive stages of the first amplifier stage comprises a first cascode transistor which has drain/source terminals each connected between one corresponding output port among the first to third output ports and the input node of the first type drive stage and is independently variable.

7. The low noise amplifier of claim 6, wherein the second type drive stage of the second amplifier stage comprises a second-first cascode transistor which has drain/source terminals each connected between the second output port and an input node of the second type drive stage and is independently variable, and
the second type drive stage of the third amplifier stage comprises a second-second cascode transistor which has drain/source terminals each connected between the second output port and the input node of the second type drive stage and is independently variable.

8. The low noise amplifier of claim 1, wherein the plurality of operation modes comprise an inter-band carrier aggregation mode, a contiguous intra-band carrier aggregation mode, and a non-contiguous intra-band carrier aggregation mode.

9. A low noise amplifier comprising:
at least one input port configured to receive a carrier as an input signal;
first to n-th output ports connected to n load circuits, respectively, n is a natural number greater than or equal to 2;
a first amplifier stage comprising a first gain stage connected to the input port and configured to amplify the input signal and n drive stages connected to the first to nth output ports, respectively; and
second to n-th amplifier stages, each comprising a second gain stage connected to the input port and configured to amplify the input signal and a cascode transistor connected between one of the second to nth output ports and an output terminal of the gain stage and configured to transmit the amplified input signal to the load circuit corresponding to the output port,
wherein each of the first gain stage and the second gain stage comprises
an input capacitor having one end connected to the input port,
a degeneration inductor having one end connected to a ground terminal, and
an input transistor having a gate connected to the other end of the input capacitor and connected between an input node of the drive stage and the other end of the degeneration inductor, and
the input transistor is configured to vary an impedance so that an input impedance and a parasitic impedance are uniform regardless of an operation mode.

10. The low noise amplifier of claim 9, wherein, when the low noise amplifier operates in an inter-band carrier aggregation mode, the low noise amplifier enables one of the first gain stage and the n drive stages of the first amplifier stage and disable the second to n-th amplifier stages to output the amplified input signal to each of the n load circuits.

11. The low noise amplifier of claim 9, wherein, when the low noise amplifier operates with 2 channels in a non-contiguous intra-band carrier aggregation mode, the low noise amplifier enables one of the first gain stage and the n drive stages of the first amplifier stage, enables the second amplifier stage, and disables the third to n$^{th}$ amplifier stages to output the amplified output signal to each of two corresponding load circuits among the n load circuits.

12. The low noise amplifier of claim 9, wherein, when the low noise amplifier operates with three channels in a non-contiguous intra-band carrier aggregation mode, the low noise amplifier enables one of the first gain stage and the n drive stages of the first amplifier stage, enables the second to third amplifier stages, and disables the fourth to n-th amplifier stages to output the amplifier input signal to each of three corresponding load circuits among the n load circuits.

13. The low noise amplifier of claim 9, wherein each of input transistors of the first to n$^{th}$ amplifier stages comprises a plurality of transistors connecting the other end of the input capacitor and the input port according to a variable switch and each having a different impedance value and the low noise amplifier varies an impedance of the input transistor by turning on or off the variable switch according to the operation mode.

14. The low noise amplifier of claim 9, wherein the first gain stage comprises,
 a compensation degeneration inductor connected between the degeneration inductor and the input transistor, and
 a switch connected to both ends of the compensation degeneration inductor and configured to allow current to bypass the degeneration inductor according to the operation mode.

15. The low noise amplifier of claim 9, wherein the input transistor and the cascode transistor included in each of the first to n$^{th}$ amplifier stages are independently variable.

16. A receiver capable of wireless communication, comprising:
 switches/duplexers configured to route a transmission/reception input signal;
 input circuits configured to provide the routed input signal by performing power and impedance matching;
 a low noise amplifier configured to provide first to third output signals by amplifying the provided input signal; and
 first to third load circuits configured to receive the first to third output signals, respectively,
 wherein the low noise amplifier comprises
 a first amplifier stage connected between an input port through which the input signal is received and the first to third load circuits;
 a second amplifier stage connected between the input port and the second load circuit; and
 a third amplifier stage connected between the input port and the third load circuit, and
 the first to third amplifier stages are configured to vary an input transistor so that the low noise amplifier has a uniform input impedance regardless of an operation mode of the low noise amplifier.

17. The receiver of claim 16, wherein the first amplifier stage comprises a first input transistor having a gate connected to the input port, the second amplifier stage comprises a second input transistor having a gate connected to the input port, the third amplifier stage comprises a third input transistor having a gate connected to the input port,
 the first input transistor, the second transistor, and the third transistor comprise a plurality of transistors each having a gate connected to the input port according to a variable switch and having a different impedance value, and impedances of the input transistors are varied by turning on or off the variable switch.

18. The receiver of claim 17, wherein the first amplifier stage further comprises
 a first degeneration inductor connected between a ground terminal and the first input transistor;
 a first cascode transistor connected between a drain terminal of the first input transistor and the first load circuit;
 a second cascode transistor connected between the drain terminal of the first input transistor and the second load circuit; and
 a third cascode transistor connected between the drain terminal of the first input transistor and the third load circuit, and
 each of the first to third cascode transistors is enabled or disabled according to the operation mode to output the amplified input signal to at least one of the first to third load circuits.

19. The receiver of claim 18, wherein the second amplifier stage further comprises a second degeneration inductor connected between the ground terminal and the second input transistor and a fourth cascode transistor connected between a drain terminal of the second input transistor and the second load circuit, and
 the third amplifier stage further comprises a third degeneration inductor connected between the ground terminal and the second input transistor and a fifth cascode transistor connected between a drain terminal of the third input transistor and the third load circuit.

20. The receiver of claim 16, wherein inductance of a degeneration inductor included in the first amplifier stage is different from inductance of the second amplifier stage or the third amplifier stage.

\* \* \* \* \*